(12) United States Patent
Park et al.

(10) Patent No.: US 9,736,938 B2
(45) Date of Patent: Aug. 15, 2017

(54) DISPLAY PANEL

(71) Applicant: LG Display Co., Ltd., Seoul (KR)

(72) Inventors: KyoungSeok Park, Gyeonggi-do (KR);
Chan Park, Gyeonggi-do (KR);
JongChul Lee, Gyeongsangbuk-do (KR); Heungju Jo,
Chungcheongbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/189,441

(22) Filed: Jun. 22, 2016

(65) Prior Publication Data
US 2017/0006702 A1 Jan. 5, 2017

(30) Foreign Application Priority Data
Jun. 30, 2015 (KR) .................. 10-2015-0093842

(51) Int. Cl.
*H05K 1/09* (2006.01)
*G02F 1/1333* (2006.01)
*H05K 3/28* (2006.01)

(52) U.S. Cl.
CPC ............ *H05K 1/092* (2013.01); *G02F 1/1333* (2013.01); *H05K 3/285* (2013.01); *H05K 2201/0108* (2013.01); *H05K 2201/0154* (2013.01); *H05K 2201/10128* (2013.01); *H05K 2203/085* (2013.01); *H05K 2203/1131* (2013.01)

(58) Field of Classification Search
CPC .................................................... H05K 1/092
See application file for complete search history.

(56) References Cited

U.S. PATENT DOCUMENTS

| | | | | |
|---|---|---|---|---|
| 2008/0171450 A1* | 7/2008 | Molkkari | ............... | C09D 11/30 439/65 |
| 2008/0236890 A1* | 10/2008 | Sugahara | ............. | B41J 2/14233 174/9 F |
| 2010/0079692 A1* | 4/2010 | Hwang | ............. | G02F 1/136204 349/40 |
| 2010/0175610 A1* | 7/2010 | Bower | ................... | G01K 11/08 116/217 |
| 2011/0279401 A1* | 11/2011 | Hong | ...................... | G06F 3/044 345/174 |
| 2012/0026107 A1* | 2/2012 | Kim | ........................ | G06F 3/044 345/173 |
| 2012/0275119 A1* | 11/2012 | Allen | ..................... | B82Y 30/00 361/728 |

* cited by examiner

*Primary Examiner* — Hoa C Nguyen
(74) *Attorney, Agent, or Firm* — Morgan, Lewis & Bockius LLP

(57) ABSTRACT

A conductive ink path on a peripheral portion of one surface of a substrate is provided. The conductive ink path comprises a body portion located along an edge of the peripheral portion of the substrate; and at least one extension portion protruded in a direction toward the edge of the substrate, wherein the extension portion includes at least one first segment extended in a first direction and at least two second segments neighboring on the first segment, the first segment includes a connector portion for receiving an electrical signal from the outside, and the first segment is located between the second segments in order to disperse ink in the first segment to the second segments during a manufacturing process.

21 Claims, 19 Drawing Sheets

DISPLAY PANEL

CROSS-REFERENCE TO RELATED APPLICATIONS

This application claims the priority of Korean Patent Application No. 10-2015-0093842 filed on Jun. 30, 2015, in the Korean Intellectual Property Office, the disclosure of which is incorporated herein by reference.

BACKGROUND

Field

The present disclosure relates to a display panel and more particularly, to a display panel including a conductive path implemented with a conductive ink.

Description of the Related Art

As a method for forming a metal line having a continuous and integrated loop shape, there is a method of inkjet printing using a metallic ink. The inkjet printing has an advantage of being able to freely form a desired pattern on a substrate by adjusting a position, a moving speed and a jet velocity of a nozzle.

However, in case of jetting the metallic ink on the substrate, it takes a long time to remove a solvent from the flowable metallic ink. Further, while the metallic ink is solidified by removing the solvent, metal may be lost. Further, an unintended pattern may be obtained as a result of inkjet printing. Therefore, the metallic ink may have a problem of conglomeration or condensation.

SUMMARY

Accordingly, the present invention is directed to a display panel that substantially obviates one or more of the problems due to limitations and disadvantages of the related art.

An object of the present disclosure is to provide a display panel including a conductive path formed by inkjet printing.

Further, another object of the present disclosure is to provide a display panel including a conductive path. The conductive path has a minimized sheet resistance value or contact resistance value since it is formed into an integrated, seamless, and continuous shape.

Furthermore, yet another object of the present disclosure is to provide a display panel including a conductive path. At an edge or a protruded region of the conductive path, a pull-back region remaining on and around the conductive path is substantially removed.

Also, still another object of the present disclosure is to provide a display panel including a conductive path. The conductive path has a generally uniform resistance value by substantially removing a pull-back region remaining on and around the conductive path.

Further, still another object of the present disclosure is to provide a display panel including a conductive path. The conductive path is formed in a reduced process time by removing a solvent of ink in a short time while substantially removing a pull-back region remaining on and around the conductive path.

Furthermore, still another object of the present disclosure is to provide a display panel including a conductive path. The conductive path has an intended shape by substantially removing a pull-back region remaining on and around the conductive path.

Also, still another object of the present disclosure is to provide a display panel in which a pull-back region remaining around a conductive path is substantially removed, and, thus, disconnection of the conductive path at any position is minimized.

Further, still another object of the present disclosure is to provide a display panel including a conductive path. The conductive path is covered with a protective layer so that a loss of an edge or extension portion (or protruded region) of the conductive path is minimized during a cleaning process.

Furthermore, still another object of the present disclosure is to provide a display panel including a conductive path. Due to a protective layer that covers the conductive path having an integrated loop shape, the protective layer is more properly brought into contact with a surface on which the conductive path is formed.

Also, still another object of the present disclosure is to provide a display panel including a conductive path. The conductive path is configured to be in direct contact with a shielding layer for reducing a touch noise of the display panel so that induced static electricity can be discharged more effectively and thus a touch function can be improved.

Further, still another object of the present disclosure is to provide a display panel including a conductive path. A difference in thickness or volume between a spot of an extension portion of the conductive path with a greater thickness or volume of a conductive ink and the other spots of the extension portion is reduced. Thus, it is possible to suppress ink-peeling at the spot with a greater thickness or volume of a conductive ink.

Furthermore, still another object of the present disclosure is to provide a display panel including a conductive path. In the display panel, an extension portion of the conductive path has a small-loop shape or a bridge. Thus, it is possible to minimize concentration of a conductive ink on an end of the extension portion where a connector portion is disposed.

Also, still another object of the present disclosure is to provide a display panel including a conductive path. In the display panel, a conductive ink has a balance of a thickness or volume at all spots of an extension portion of the conductive path. Thus, it is possible to suppress a burst of the conductive path during a curing or sintering process.

Further, still another object of the present disclosure is to provide a display panel including a conductive path. In case where a connector portion needs to be defined as being on one side of an extension portion of the conductive path, an ear is added to the one side of the extension portion. Thus, a pull-back region can be spaced from the connector portion.

Furthermore, still another object of the present disclosure is to provide a display panel including a conductive path. In the display panel, the conductive path is formed of a conductive ink jetted and then cured or sintered. Thus, it is possible to suppress a partial loss of the conductive path caused by permeation of distilled water through a crack during a cleaning process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a conductive ink path on a peripheral portion of one surface of a substrate comprises a body portion located along an edge of the peripheral portion of the substrate; and at least one extension portion protruded in a direction toward the edge of the substrate, wherein the extension portion includes at least one first segment extended in a first direction and at least two second segments neighboring on the first segment, the first segment includes a connector portion for transferring an electrical signal, and the first segment is located between the second segments and configured to disperse ink in the first segment to the second segments during a manufacturing process.

In another aspect, a display device comprises a substrate defined by an active area and an inactive area; a conductive layer on the substrate; a conductive ink path on the conductive layer; and a protective layer on the conductive ink path, wherein the conductive layer is in the active area and the inactive area, the conductive ink path is electrically connected to the conductive layer in the inactive area, the protective layer insulates the conductive ink path along a shape of the conductive ink path, wherein the conductive ink path includes: a body portion surrounding the active area; and at least one extension portion protruded in a direction toward an edge of the substrate from the body portion, and wherein the body portion and the extension portion are connected to each other and configured into an integrated shape.

According to example embodiments of the present disclosure, it is possible to provide a display panel including a conductive path implemented with a conductive ink. The conductive path has a minimized sheet resistance value or contact resistance value since it is formed into an integrated, seamless, and continuous shape.

Further, according to example embodiments of the present disclosure, it is possible to provide a display panel including a conductive path and a manufacturing method thereof. At an edge or a protruded region of the conductive path, a pull-back region remaining on and around the conductive path is substantially removed.

Furthermore, according to example embodiments of the present disclosure, it is possible to provide a display panel including a conductive path and a manufacturing method thereof. The conductive path has a generally uniform resistance value by substantially removing a pull-back region remaining on and around the conductive path.

Also, according to example embodiments of the present disclosure, it is possible to provide a display panel including a conductive path and a manufacturing method thereof. The conductive path is formed in a reduced process time by removing a solvent of ink in a short time while substantially removing a pull-back region remaining on and around the conductive path.

Further, according to example embodiments of the present disclosure, it is possible to provide a display panel including a conductive path and a manufacturing method thereof. In the display panel, a pull-back region remaining around the conductive path is substantially removed and thus disconnection of the conductive path at any position is minimized.

Furthermore, according to example embodiments of the present disclosure, it is possible to provide a display panel including a conductive path and a manufacturing method thereof. The conductive path is covered with a protective layer so that a loss of an edge or protruded region of the conductive path is minimized during a cleaning process.

Also, according to example embodiments of the present disclosure, it is possible to provide a display panel including a conductive path and a manufacturing method thereof. Due to a protective layer that covers the conductive path having an integrated loop shape, the protective layer is more properly brought into contact with a surface on which the conductive path is formed.

Further, according to example embodiments of the present disclosure, it is possible to provide a display panel including a conductive path and a manufacturing method thereof. The conductive path is configured to be in direct contact with a shielding layer for reducing a touch noise of the display panel so that induced static electricity can be discharged more effectively and thus a touch function can be improved.

Furthermore, according to example embodiments of the present disclosure, it is possible to provide a display panel including a conductive path. A difference in thickness or volume between a spot of an extension portion of the conductive path with a greater thickness or volume of a conductive ink and the other spots of the extension portion is reduced. Thus, it is possible to suppress an occurrence of ink-peeling at the spot with a greater thickness or volume of a conductive ink.

Also, according to example embodiments of the present disclosure, it is possible to provide a display panel including a conductive path. In the display panel, an extension portion of the conductive path has a small-loop shape or a bridge. Thus, it is possible to minimize concentration of a conductive ink on an end of the extension portion where a connector portion is disposed.

Further, according to the present disclosure, it is possible to provide a display panel including a conductive path. In the display panel, a conductive ink has a balance of a thickness or volume at all spots of an extension portion of the conductive path. Thus, it is possible to suppress a burst of the conductive path during a curing or sintering process.

Further, according to example embodiments of the present disclosure, it is possible to provide a display panel including a conductive path. In case where a connector portion needs to be defined as being on one side of an extension portion of the conductive path, an ear is added to the one side of the extension portion. Thus, a pull-back region can be spaced from the connector portion.

Furthermore, according to example embodiments of the present disclosure, it is possible to provide a display panel including a conductive path. In the display panel, the conductive path is formed of a conductive ink jetted and then cured or sintered. Thus, it is possible to suppress a partial loss of the conductive path caused by permeation of distilled water through a crack during a cleaning process.

It is to be understood that both the foregoing general description and the following detailed description are exemplary and explanatory and are intended to provide further explanation of the invention as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
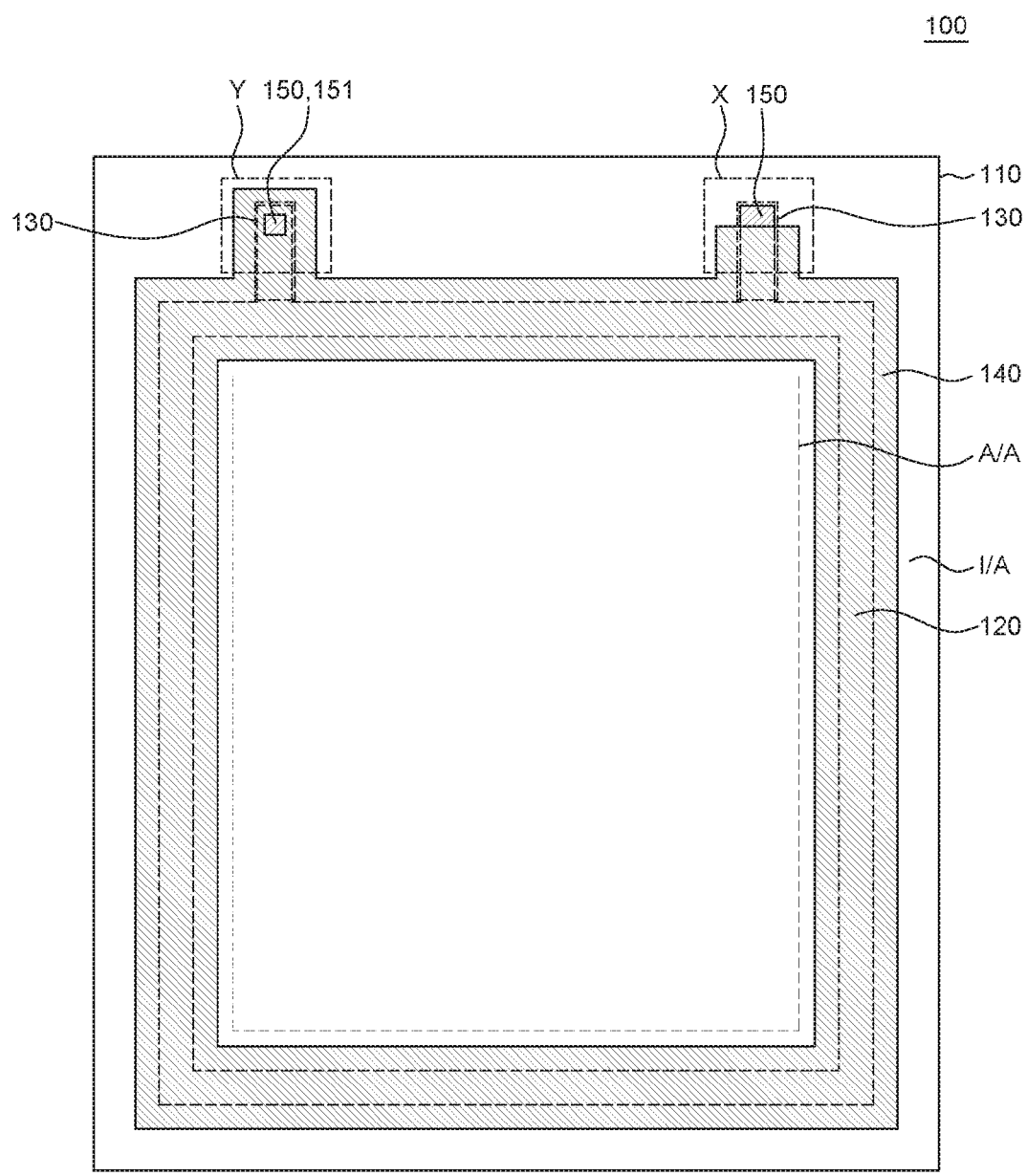
FIG. 1 is a plan view of a display panel including a conductive path and a protective layer according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto.

Like reference numerals generally denote like elements throughout the present specification.

In the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only".

Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately", "directly", or "in contact with".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Further, in describing components of the present disclosure, terms such as first, second, A, B, (a), and (b) can be used. These terms are used only to differentiate the components from other components. Therefore, the nature, order, sequence, or number of the corresponding components is not limited by these terms. It is to be understood that when one element is referred to as being "connected to" or "coupled to" another element, it may be directly connected to or directly coupled to another element, connected to or coupled to another element, having still another element "intervening" therebetween, or "connected to" or "coupled to" another element via still another element.

In the present disclosure, the term "loop-shaped conductive path" means a conductive path having a ring shape of which the closed inside can be distinguished from the outside. For example, the loop-shaped conductive path may be a conductive path having a circular shape with a hollow center, an oval shape with a hollow center, a rectangular shape with a hollow center, a square shape with a hollow center, a diamond shape with a hollow center, a trapezoidal shape with a hollow center, or any shape with a hollow center.

In the present disclosure, the term "integrated conductive path" means a conductive path having a seamless and continuous shape. The integrated conductive path is continuously formed without any interval of time when actually manufactured, and, thus, the integrated conductive path is seamless without being overlapped with another portion or connected by any intervening element.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

FIG. 1 is a plan view of a display panel including a conductive path and a protective layer according to an exemplary embodiment of the present disclosure.

Referring to FIG. 1, a display panel 100 according to an exemplary embodiment of the present disclosure includes a substrate 110, an active area A/A, an inactive area I/A, a conductive path 120, an extension portion 130, a protective layer 140, a hole 151, and a connector portion 150.

The display panel 100 according to an exemplary embodiment of the present disclosure is divided into the active A/A and the inactive area I/A adjacent to the active area A/A. For example, the inactive area I/A may be disposed around the active area A/A and may also surround the active area A/A. Further, the inactive area I/A may have a closed loop shape such as a ring. The active area A/A refers to an area where an image is actually displayed on the display panel, and the inactive area I/A refers to an area other than the area where an image is actually displayed on the display panel.

The components included in the display panel 100 are disposed on the substrate 110, and the substrate 110 is configured to support a shape of the display panel 100. That is, the substrate 110 serves as a basic frame for the display panel 100. The substrate 110 may be fixed in a flat state or fixed in a bent or curved state, or may be provided with flexibility. Further, the substrate 110 may be formed of a glass or a plastic-based polymer material. The substrate 110 may be transparent or translucent.

The conductive path 120 may have a closed shape. That is, the conductive path 120 may have a loop shape such as a ring. If the conductive path 120 has a closed shape, the conductive path 120 may have an integrated shape. Herein, the integrated shape means a single continuous shape without a connection by an overlap. Otherwise, the integrated shape means a single continuous shape without a connection between two spots through an intervening element.

The conductive path 120 may be disposed in the inactive area I/A. In this case, the conductive path 120 may surround the active area A/A of the substrate 110. For example, the conductive path 120 may be disposed such that the closed shape of the conductive path 120 surrounds the active area A/A.

The conductive path 120 includes conductive particles. The conductive particles may be formed of a highly conductive metal material, such as silver (Ag), copper (Cu), and chromium (Cr), or an alloy thereof. The conductive particles may be dispersed in a polar organic material, which is maintained in a liquid state at room temperature. The conductive particles may be conglomerated or condensed so as to form the conductive path 120.

The conductive path 120 may further include a dispersant that promotes dispersion of the conductive particles. In this case, the dispersant may be formed of a polar material which is dissolved easily in a polar solvent.

The conductive path 120 may be disposed on the substrate 110 by jetting a conductive ink onto the substrate 110 into a desired design. More specifically, the conductive path 120 is manufactured by jetting the conductive ink, removing a solvent in the conductive ink to maintain a shape of the jetted conductive ink, and performing a curing (or sintering) process. In this case, as a method for jetting conductive ink into a desired design, an inkjet printing method may be used.

Herein, the term "conductive ink" refers to a kind of paste-state composition in which conductive particles are dispersed in an organic material which is maintained in a liquid state at room temperature. The conductive ink has flowability and viscosity, and also has a surface tension suitable to be jetted into a line shape. Thus, the conductive ink can be maintained in a shape as jetted. Herein, the conductive ink may include the organic material, in which the conductive particles can be uniformly dispersed and which is maintained in a liquid state at room temperature, as a base. For example, the organic material may be a polar organic solvent with viscosity and an alcohol functional group, such as Triethylene Glycol Monoethyl Ether (TGME). In the following, an organic solvent included in the conductive ink will be assumed and described as a polar organic solvent. However, this is just an example. A nonpolar organic solvent may be used depending on the properties of the conductive particles or the properties of a dispersant to be added. While the conductive ink is cured, most of the polar organic material is removed by evaporation or vaporization. However, a very small amount of the polar organic material included in the jetted conductive ink cannot be evaporated or vaporized but still remains in the conductive path 120. Thus, with a small amount of the polar organic material remaining therein, the conductive path 120 has a shape formed by conglomeration of the conductive particles. That is, the conductive path 120 has a structure in which the polar organic material and the conductive particles are conglomerated.

Particularly, a TFT layer of the display panel may have a defect in a high temperature environment, which may cause a change in performance of the display panel. In most cases, it is considered that a TFT layer has a defect at a temperature of higher than 130° C. More specifically, a temperature of higher than 130° C. is regarded as a temperature at which a liquid crystal layer or an organic emission layer on the TFT layer can be degenerated. If the boiling point of the polar organic material included in the conductive ink is equal to or higher than a temperature at which the display panel has a defect, the polar organic material remains in the conductive path 120.

A curing or sintering temperature of the conductive ink cannot be increased to be equal to or higher than a temperature which causes a change in performance of the display panel. Therefore, the polar organic material may be evaporated but cannot be vaporized. A method of removing the polar organic material by evaporation instead of vaporization requires a longtime, and, thus, actually has a low applicability. Further, the polar organic material remaining in the conductive path 120 does not affect the performance of the conductive path 120. Therefore, a process of removing the polar organic material is ended although a residual amount of the polar organic material remains in the conductive path 120. Therefore, a residual amount of the polar organic material suitable to analyze whether or not the polar organic material is included and specifically analyze the composition of the polar organic material remains in the conductive path 120.

Further, the conductive ink may include a viscous organic material formed of a different material from the polar organic material. The viscous organic material included in the conductive ink improves adherence of a conductive path to be formed onto a surface on which the conductive ink is jetted. In other words, the viscous organic material increases the adhesion of the conductive path 120 after a curing or sintering process to the conductive ink. Herein, preferably, the boiling point of the viscous organic material may be higher than the boiling point of the polar organic material. If so, when the polar organic material as a base material of the conductive ink is removed by vaporization, the viscous organic material can remain in the conductive ink.

The conductive path 120 may include at least one protruded region, i.e., extension portion 130, on one lateral surface. The extension portion 130 may have a shape extended from the one lateral surface of the conductive path 120 toward an edge or outside of the display panel 100 according to an exemplary embodiment of the present disclosure. That is, the extension portion 130 may be disposed so as to face the outside of the conductive path 120 rather than the inside of the conductive path 120. The extension portion 130 may be further protruded to the outside than a protective layer 140. On the contrary, the protective layer 140 may be further protruded to the outside than the extension portion 130. Otherwise, the extension portion 130 may be less protruded than the protective layer 140, or the protective layer 140 may be less protruded than the extension portion 130. In other words, an end of the extension portion 130 and an end of the protective layer 140 may share a cross section. The extension portion 130 is a part of the conductive path 120. Therefore, all the descriptions regarding the properties of the conductive path 120 can be applied to the extension portion 130. An electrical signal may be applied to the conductive path 120 through the extension portion 130. That is, a current or voltage may be applied to the conductive path 120 through the protruded extension portion 130. For example, the conductive path 120 may be grounded through the extension portion 130. Herein, the hole 151 and the connector portion 150 to be described later may be disposed on an upper surface of the extension portion 130. An end of the extension portion 130 illustrated in FIG. 1 is extended to an end of a corner of the display panel 100 according to an exemplary embodiment of the present disclosure. Further, the end of the extension portion 130 and the end of the corner of the display panel 100 according to an exemplary embodiment of the present disclosure may share a cross section (or lateral surface). Otherwise, the end of the extension portion 130 and an end of a corner of the substrate 110 may share a cross section.

The protective layer 140 may be disposed in direct contact with the conductive path 120. Herein, a lower surface of the conductive path 120 refers to a surface of the conductive path 120 that is in contact with a surface on which the conductive ink is jetted. An upper surface of the conductive path 120 is not in contact with the surface on which the conductive ink is jetted. Therefore, the lower surface of the conductive path 120 has a flat shape, and the upper surface of the conductive path 120 has an inclined shape, which is gradually decreased in thickness from the center toward the edge of the conductive path 120.

The protective layer 140 has a similar design as the conductive path 120 and is configured to cover the upper surface of the conductive path 120. In this case, the protective layer 140 has a similar shape as the conductive path 120 but has a width greater than that of the conductive path 120. Further, similar to the conductive path 120, the protective layer 140 may also have a loop shape such as a ring. Furthermore, similar to the conductive path 120, the protective layer 140 may also be disposed in the inactive area I/A. If the protective layer 140 is optically transparent, the protective layer 140 may be formed as a continuous layer disposed over from the active area A/A to the inactive area I/A unlike the conductive path 120.

Since the protective layer 140 is configured to cover the conductive path 120, it can have a width greater than that of the conductive path 120 regardless of the shape of the conductive path 120. As a result, some parts of the protective layer 140 may be in direct contact with a surface on which the conductive ink is jetted without intervention of the conductive path 120 therebetween. Herein, the surface on which the conductive ink is jetted may be the substrate 110 or any conductive layer (not illustrated) positioned between the substrate 110 and the conductive path 120 to be described later. Since the portion of the surface on which the conductive ink is jetted and the protective layer 140 are in direct contact with each other, it is possible to suppress a loss of the conductive path 120 from the surface on which the conductive ink is jetted.

In order to suppress a loss of the conductive path 120 and support the conductive path 120, the protective layer 140 may include a viscous organic material. Further, in order to insulate the conductive path 120 from the other components, the protective layer 140 may include an insulating material. For example, the protective layer 140 may be a colored or transparent polyimide-based material.

Although not illustrated in the drawings, the display panel 100 according to an exemplary embodiment of the present disclosure may further include a conductive layer (not illustrated) that is continuously disposed in the active area A/A and the inactive area I/A. The conductive layer (not illustrated) may be transparent and formed of any one selected from indium oxide, tin oxide, zinc oxide, indium-tin oxide, indium-zinc oxide, tin-antimony oxide, graphene, carbon nano tube, Ag nano particle, Ag nano wire, and a thin metal mesh. The conductive layer (not illustrated) may be in contact with the upper or lower surface of the conductive path 120. The conductive path 120 may be disposed between the conductive layer (not illustrated) and the protective layer 140. Herein, the conductive path 120 may be in direct contact with the conductive layer (not illustrated) and the protective layer 140. More specifically, the lower surface of the conductive path 120 may be in direct contact with the conductive layer (not illustrated) and the upper surface of the conductive path 120 may be in direct contact with the protective layer 140.

The protective layer 140 is configured to cover the upper surface of the conductive path 120 and expose a partial area of the conductive path 120 so as to form the connector portion 150. More specifically, the protective layer 140 covers the conductive path 120 along the shape of the conductive path 120 and exposes apart of the end of the extension portion 130, so that the connector portion 150 is defined. A portion where the protective layer 140 is not disposed, i.e., an exposed portion of the conductive path 120, may be the connector portion 150. In other words, the connector portion 150 may be defined as any portion of the conductive path 120, which is not covered by the protective layer 140. In some cases, a pattern of the protective layer 140 through which the connector portion 150 is exposed may have a shape of the hole 151. Details thereof will be described with reference to FIG. 2 and FIG. 3.

The connector portion 150 may enable the conductive path 120 to be applied with an electrical signal from the outside. Further, the connector portion 150 may enable the conductive path 120 to be electrically connected to the other components of the display panel 100 according to an exemplary embodiment of the present disclosure. Further, the connector portion 150 may enable a potential of the conductive path 120 to be the same as those of other components included in the display panel 100 according to an exemplary embodiment of the present disclosure. For example, the connector portion 150 may enable the conductive path 120 to be grounded. Herein, other components included in the display panel 100 according to an exemplary embodiment of the present disclosure refer to not only the components explicitly described in the present specification, but also to the components which are not explicitly described but generally regarded as components of a display panel.

Figure 8:
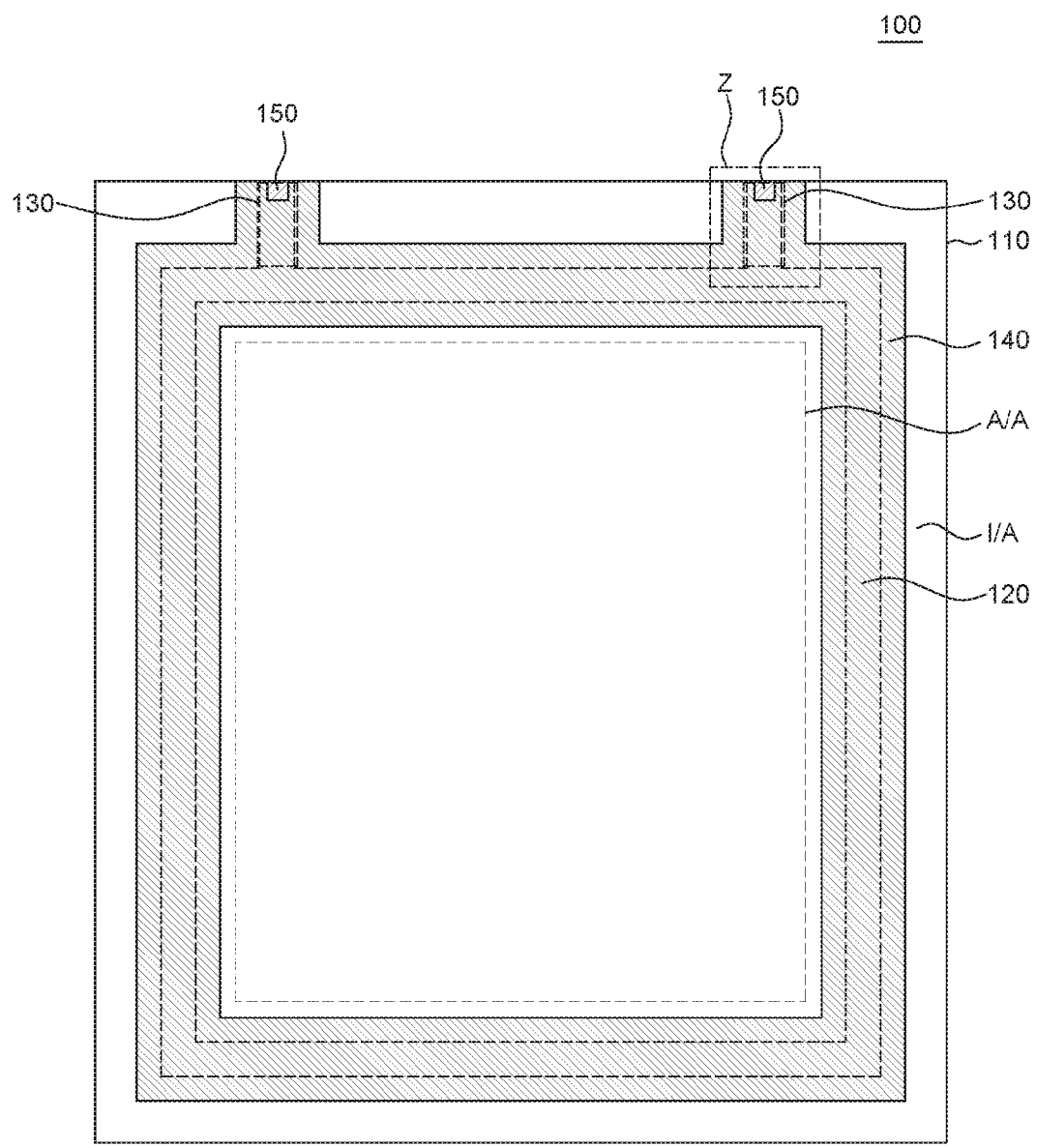
FIG. 8 is a plan view of a display panel including a conductive path and a protective layer according to an exemplary embodiment of the present disclosure.

FIG. 8 is a plan view of a display panel including a conductive path and a protective layer according to an exemplary embodiment of the present disclosure.

Referring to FIG. 8, a display panel 200 according to an exemplary embodiment of the present disclosure includes the substrate 110, the active area A/A, the inactive area I/A, the conductive path 120, the extension portion 130, the protective layer 140, and the connector portion 150. The display panel 200 illustrated in FIG. 8 according to an exemplary embodiment of the present disclosure is the same as the display panel 100 illustrated in FIG. 1 according to an exemplary embodiment of the present disclosure except a design of the extension portion 130 and the protective layer 140. Therefore, the redundant description thereof will be omitted.

The display panel 200 according to an exemplary embodiment of the present disclosure includes at least one extension portion 130 which is protruded and extended to an end of a corner of the display panel. The display panel 200 includes the conductive path 120 implemented with conductive ink, the substrate 110 on which the conductive path 120 is disposed at an edge of one surface, and a conductive layer (not illustrated) disposed between the substrate 110 and the conductive path 120 so as to be overlapped with the entire substrate 110. Further, the display panel 200 includes the protective layer 140 configured to cover the conductive path 120 along the shape of the conductive path 120 and expose a part of the extension portion 130 so as to define the connector portion 150. Herein, the extension portion 130 may be disposed such that the end of the extension portion 130 and the end of the corner of the display panel 200 share a cross section. Since the extension portion 130 is disposed such that the end of the extension portion 130 and the end of the corner of the display panel 200 share a cross section, there may be no space between the end of the protective layer 140 and the end of the corner of the display panel 200. Further, since the protective layer 140 is disposed such that the end of the protective layer 140 and the end of the extension portion 130 share a cross section, the connector portion 150 may be disposed over from the upper surface to the end of the extension portion 130. In other words, when the protective layer 140 defines the connector portion 150, the protective layer 140 is formed to expose up to the end of the extension portion 130. A part of the extension portion 130 exposed by the protective layer 140 is defined as the connector portion 150.

Further, each extension portion 130 may have at least one small-loop shape in order to minimize an occurrence of ink-peeling. The shape of the extension portion 130 included in the conductive path 120 of the display panel 200 according to an exemplary embodiment of the present disclosure will be described in more detail with reference to FIG. 10 through FIG. 13.

As illustrated in FIG. 1 and FIG. 8, the hole 151 and the connector portion 150 may be disposed in the extension portion 130 of the conductive path 120. Referring to FIG. 2 and FIG. 3, various applicable arrangements and shapes of the contact hole 151 or the connector portion 150 in the display panel 100 illustrated in FIG. 1 according to an exemplary embodiment of the present disclosure will be described in more detail.

FIG. 2 and FIG. 3 are enlarged plan views and side views of an area X of FIG. 1 where the extension portion 130 of the conductive path 120 illustrated in FIG. 1 is disposed. The position of the hole 151 or the connector portion 150 in FIG. 1 is provided only for the purpose of illustration, and the position of the hole or the connector portion in FIGS. 2 and 3 is also provided for the purpose of illustration.

FIG. 2 illustrates the connector portion 150 formed by exposing a part of the upper surface of the conductive path 120.

Figure 2A:
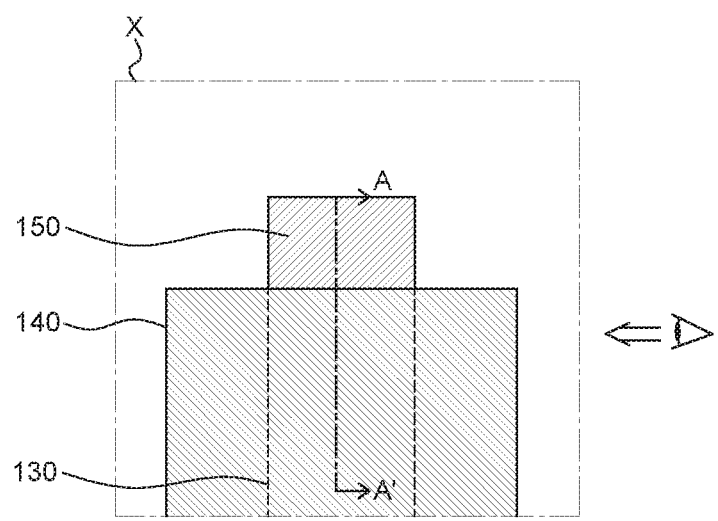
FIG. 2A is a plan view of an area X of FIG. 1.

FIG. 2A is a plan view of the area X. Referring to FIG. 2A, the extension portion 130 is further protruded to the outside than the protective layer 140. Otherwise, the protective layer 140 exposes a part of an upper edge of the extension portion 130. In other words, the protective layer 140 is configured such that a partial end of a corner of the conductive path 120 is exposed.

Herein, the connector portion 150 is the area where the part of the upper edge of the extension portion 130 is exposed. In other words, the connector portion 150 is the area where the partial end of the corner of the conductive path 120 is exposed. Meanwhile, at a portion where the protective layer 140 and the extension portion 130 are overlapped, a width of the protective layer 140 is greater than a width of the extension portion 130. Thus, the protective layer 140 is formed to cover the extension portion 130. As for the conductive path 120 which does not include the extension portion 130, the extension portion 130 may be substituted with the conductive path 120 in all descriptions.

Figure 2B:
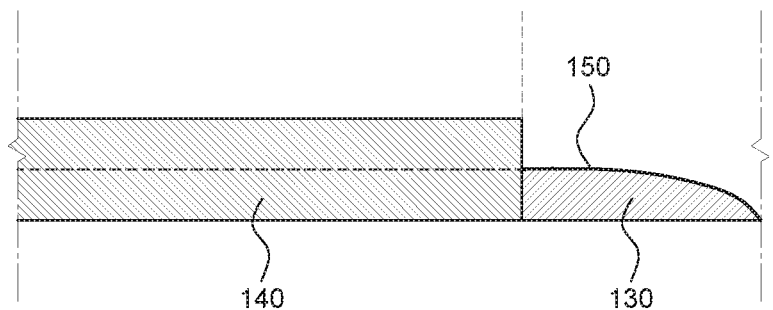
FIG. 2B is a side view of the area X of FIG. 1.

FIG. 2B is a side view of the area X. Referring to FIG. 2B, at a portion where the protective layer 140 and the extension portion 130 are overlapped, the protective layer 140 is formed to cover and shield the extension portion 130. At a portion where the protective layer 140 and the extension portion 130 are not overlapped, the extension portion 130 is formed to be protruded from the protective layer 140 toward the outside. Thus, the extension portion 130 is exposed. Herein, the connector portion 150 is an upper surface of the exposed extension portion 130.

Figure 2C:
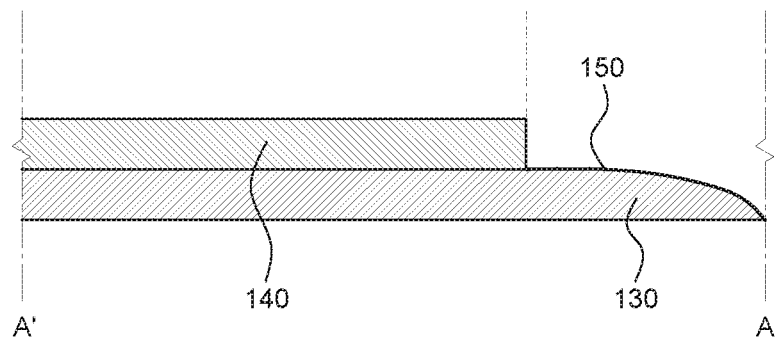
FIG. 2C is a cross-sectional view taken by vertically cutting the plan view of the area X of FIG. 1 along a line A-A'.

FIG. 2C is a cross-sectional view taken by vertically cutting the plan view of the area X along line A to A'. Referring to FIG. 2C, a portion where the protective layer 140 and the extension portion 130 are not overlapped is at a more outer position than a portion where the protective layer 140 and the extension portion 130 are overlapped. In other words, a portion where the protective layer 140 is not positioned on the upper surface of the extension portion 130 is at a more outer position than a portion where the protective layer 140 is positioned on the upper surface of the extension portion 130. Thus, the protective layer 140 is configured such that the partial end of the corner of the conductive path 120 is exposed. Herein, the connector portion 150 is the upper surface of the extension portion 130 which is exposed since the protective layer 140 is not positioned thereon.

In all description with reference to FIG. 2, as for the conductive path 120 which does not include the extension portion 130, the extension portion 130 may be substituted with the conductive path 120.

In the display panel 100 provided according to an embodiment of the present disclosure, the protective layer 140 entirely covering the conductive path 120 is included and the protective layer 140 exposes a partial area of the conductive path 120 so as to form the connector portion 150.

FIG. 3 illustrates the hole 151 and the connector portion 150 formed by shielding the entire edge of the conductive path 120.

Figure 3A:
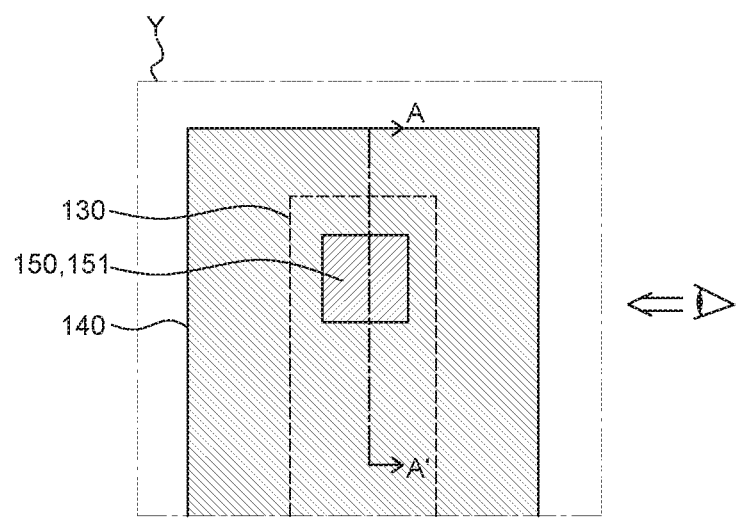
FIG. 3A is a plan view of an area Y of FIG. 1.

FIG. 3A is a plan view of an area Y. Referring to FIG. 3A, the protective layer 140 is further protruded to the outside than the extension portion 130. Otherwise, the protective layer 140 may be disposed such that the hole 151 is formed by exposing a part of the upper surface of the extension portion 130. Also, the protective layer 140 may be configured to cover the entire end of the corner of the extension portion 130. That is, the protective layer 140 may be positioned so as to entirely cover at least the edge of the upper surface of the extension portion 130. Meanwhile, a width or size of the area of the protective layer 140 is greater than a width or size of the area of the extension portion 130. Thus, the protective layer 140 may be formed to cover the extension portion 130. The upper surface of the extension portion 130 may be exposed by at least one hole 151 of the protective layer 140. The connector portion 150 is a surface of the conductive path 120 exposed through the hole 151 as such. That is, the connector portion 150 is the bottom of the hole 151.

Figure 3B:
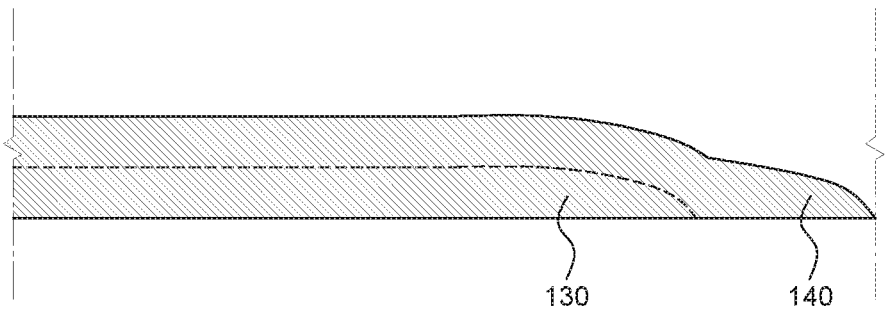
FIG. 3B is a side view of the area Y of FIG. 1.

FIG. 3B is a side view of the area Y. Referring to FIG. 3B, the protective layer 140 covers the entire edge of the extension potion 130. Thus, the extension portion 130 looks as if it does not include an exposed area.

Figure 3C:
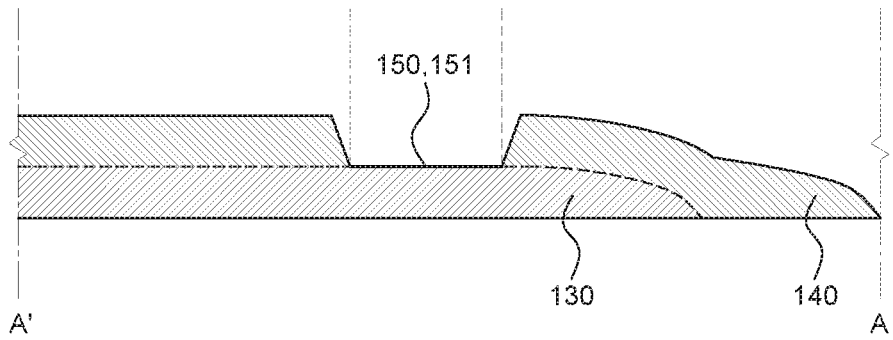
FIG. 3C is a cross-sectional view taken by vertically cutting the plan view of the area Y of FIG. 1 along the line A-A'.

FIG. 3C is a cross-sectional view taken by vertically cutting the plan view of the area Y along line A to A'. Referring to FIG. 3B again, the extension portion 130 looks as if its entire area is not exposed. However, it can be seen that the connector portion 150 as the exposed area of the surface of the extension portion 130 is actually formed. That is, referring to FIG. 3C, the protective layer 140 is formed to expose a part of the conductive path 120 through the hole 151.

More specifically, referring to FIG. 3C, the entire edge of the extension portion 130, i.e., the entire end of the corner of the extension portion 130, is covered by the protective layer 140. Meanwhile, since the protective layer 140 exposes a part of the extension portion 130 through the hole 151, there is a portion where the protective layer 140 is not overlapped with the extension portion 130.

In all description with reference to FIG. 3, as for the conductive path 120 which does not include the extension portion 130, the extension portion 130 may be substituted with the conductive path 120.

According to the display panel according to exemplary embodiments of the present disclosure, the protective layer 140 may be formed to cover the entire end of the corner of the conductive path 120 and also expose a partial area of the conductive path 120. That is, since the protective layer 140 having a pattern including the hole 151 is formed, the connector portion 150 may be formed such that the edge of the conductive path 120 is not exposed to the outside.

Thus, among back-end processes, during a cleaning process using a liquid such as distilled water, it is possible to minimize a loss of the edge of the conductive path 120. Further, a shape of the conductive path 120 can be maintained. Thus, the conductive path 120 has a generally uniform resistance value. Furthermore, through the hole 151 and the connector portion 150 maintained in a desired shape, the conductive path 120 can be more easily applied with an electrical signal.

Although not illustrated, in some cases, the hole 151 and the connector portion 150 may be positioned in other areas rather than in the protruded extension portion 130 of the conductive path 120 in the display panel according to an exemplary embodiment of the present disclosure. In this case, similar to the conductive path which does not include the extension portion, the extension portion 130 may be substituted with the conductive path 120 in all descriptions.

Meanwhile, while the conductive path 120 is manufactured by a method of evaporating or vaporizing the organic material from the conductive ink, a pull-back region may be formed around the conductive path 120. Hereinafter, the pull-back region will be described with reference to FIG. 5.

Figure 5:
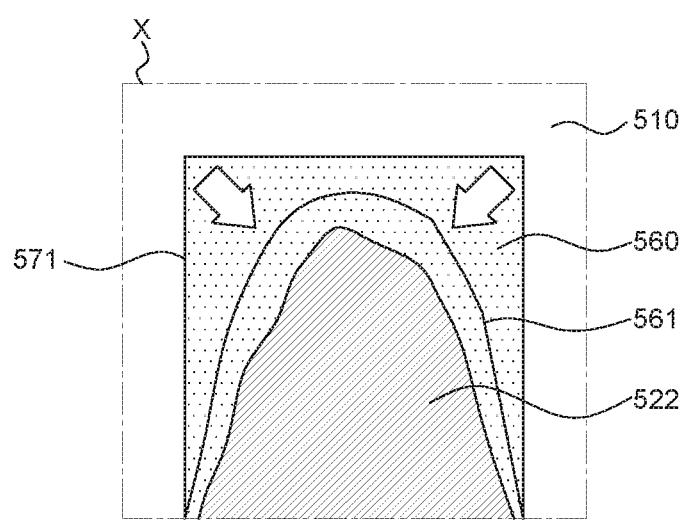
FIG. 5 is a plan view enlarging a portion of a conventional conductive path corresponding to the area X of FIG. 1.

FIG. 5 is a plan view enlarging a portion of a conventional conductive path corresponding to the area X of FIG. 1. For reference, a pull-back region 560 is illustrated around a certain area of the conventional conductive path corresponding to the area X of FIG. 1. Although not illustrated, the pull-back region 560 may appear in any area around the conductive path.

The arrows in FIG. 5 indicate a contraction direction of the conductive ink as a volume of the organic material included in the conductive ink gradually decreases. This direction is the same as a direction in which the conductive particles move while being conglomerated. The contraction direction of the conductive ink can be recognized by a trace of the conductive ink during a contraction process. The trace of the conductive ink can be observed with the naked eye or through a microscope, and it is referred to as the pull-back region 560. Herein, the pull-back region 560 refers to a trace region in which the organic material included in the conductive ink is removed by evaporation or vaporization and thus the conductive ink is decreased and contracted in volume. That is, the pull-back region 560 is a trace region remaining after the polar organic material is removed from the conductive ink in the same manner as being stained. Herein, the solvent of the conductive ink may be removed through several discontinuous processes with a certain interval of time under the same or different conditions rather than through a single continuous process. In this case, a border 561 of a stain may be formed in the pull-back region 560 so as to correspond to the number of processes.

Herein, a size of the pull-back region 560 may be the same as a size between a border 571 to which the conductive ink is jetted and a conductive path 520 as can be recognized with the naked eye or through a microscope. Otherwise, a size of the pull-back region 560 may be the same as a size between the border 561 of the stain and the conductive path 520 as can be recognized with the naked eye or through a microscope.

As a result, a size of the pull-back region 560 is proportional to a degree of difference between (1) a shape when the conductive ink is jetted and (2) a shape of a conductive path 522 formed by removing the organic material from the jetted conductive ink and curing the conductive ink. That is, a size of the pull-back region 560 refers to an error between (1) an intended design of the conductive path when the conductive ink is jetted and (2) a resulting design of the conductive path 522.

Typically, if a conductive path is used as a path for an electrical signal, a thickness and a width of the conductive path need to be uniform in the entire area. However, if the conductive path is formed into a non-smooth and non-uniform shape, a resistance value of the conductive path is also changed in part. Further, disconnection in the conductive path may occur at any position. The pull-back region 560 reflects such non-uniformity in shape or performance of the conductive path. Further, a size of the pull-back region 560 may be regarded as a size of a dummy area or a margin in terms of operation of a process. In order to suppress the disconnection in the conductive path or to reduce a margin area, it is necessary to minimize a size of the pull-back area 560.

As a result, from a shape or a size of the pull-back region 560, a shape and performance of the conductive path 522 can be indirectly determined. More specifically, it can be determined that as a size of the pull-back region 560 increases, uniformity in shape of the conductive path 522 decreases. Further, it can be determined that as a size of the pull-back region 560 increases, performance of the conductive path 522 decreases.

The inventors of the present disclosure paid attention to (1) a contraction speed of the conductive ink caused by a surface tension of the conductive ink, (2) an evaporation or vaporization speed of the organic material, and (3) a volume of pores remaining in the conductive ink while the conductive path is formed using the conductive ink. Further, the inventors of the present disclosure found that the size of the pull-back region 560 is relevant to these three factors. As a result, the inventors of the present disclosure invented the conductive path 120 illustrated in FIG. 6 according to an exemplary embodiment of the present disclosure. Hereinafter, the conductive path 120 according to an exemplary embodiment of the present disclosure will be described with reference to FIG. 6.

Figure 6:
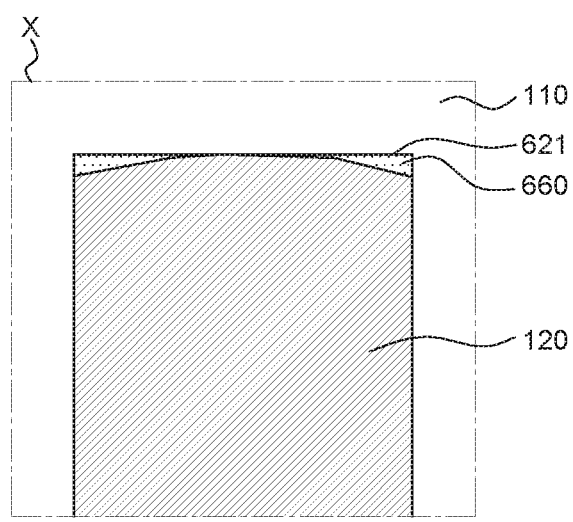
FIG. 6 is a schematic diagram illustrating a plan view of a conductive path 120 according to an exemplary embodiment of the present disclosure.

FIG. 6 is a schematic diagram illustrating a plan view of the conductive path 120 according to an exemplary embodiment of the present disclosure.

The inventors of the present disclosure determined that the organic material needs to be rapidly removed before the conductive ink is contracted to have a minimum surface area by removing the organic material as a solvent in the conductive ink. Thus, the inventors of the present disclosure tried to induce the conductive particles dispersed in the organic material to rapidly settle down on the substrate 110. Details thereof will be described below.

A volume of the conductive ink gradually decreases while the organic material is removed by evaporation or vaporization. In the meantime, the conductive ink is contracted to have a minimum surface area by a surface tension of the conductive ink. The conductive particles are conglomerated along with contraction of the conductive ink. Such a movement of the conductive particles is left as a trace, i.e., a pull-back region. The inventors of the present disclosure found evaporation or vaporization conditions for most rapidly removing the organic material through various experiments. The organic material can be removed in a high-degree vacuum state as one of the evaporation or vaporization conditions. That is, the inventors of the present disclosure found that the organic material can be removed by a high-degree vacuum drying process.

The high-degree vacuum drying process refers to a process for removing liquid by vaporization, i.e., a phase transition from liquid to gas. The inventors of the present disclosure lowered the boiling point of the organic material of the conductive ink by reducing a pressure in an environment where the organic material is evaporated and vaporized. More specifically, the pressure was reduced such that the boiling point of the organic material is lower than a temperature, for example, about 130° C., which generally causes a change in performance of a display panel. That is, the environment was set such that the solvent of the conductive ink can undergo a phase transition from liquid to gas without a change in performance of the display panel. Further, when an organic material having the boiling point of 130° C. at a certain pressure between the atmospheric pressure and a pressure at the triple point was used as a solvent of the conductive ink, the environment was set such that the organic material can be vaporized at a pressure lower than the atmospheric pressure. Furthermore, the environment was set such that vaporization can be more actively carried out by removing the organic material vaporized into gas from the environment by suction. Since the high-degree vacuum drying process was performed under this environment, the organic material can be rapidly removed. Further, the conductive particles can be conglomerated at a position where the conductive ink is initially jetted without allowing time for the conductive particles to move.

In this way, the high-quality and high-performance conductive path 120 can be manufactured with a substantially negligible size of a pull-back region.

Further, the inventors of the present disclosure induced the conductive particles to be more rapidly settled by removing micro-pores present in the conductive ink. Furthermore, the inventors of the present disclosure induced the conductive particles to be more rapidly conglomerated by reducing a distance between the conductive particles. Details thereof will be described with reference to FIG. 7A and FIG. 7B.

Figure 7A:
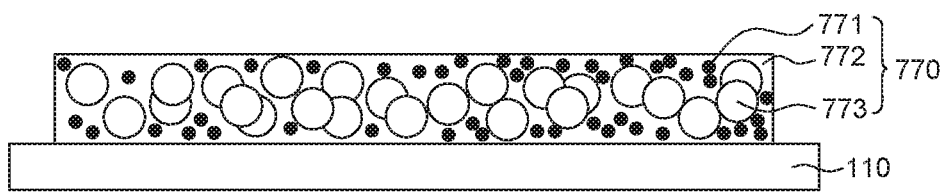
FIG. 7A is a schematic diagram illustrating the inside of a conductive ink when the conductive ink is present at the atmospheric pressure.
Figure 7B:
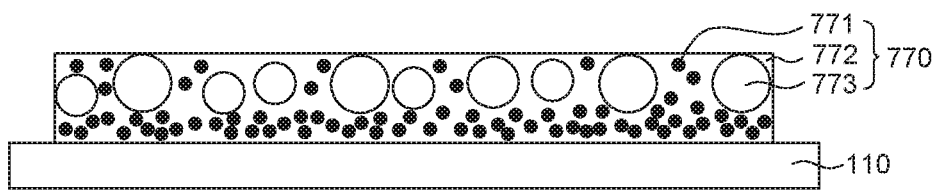
FIG. 7B is a schematic diagram illustrating the inside of a conductive ink when a solvent of the conductive ink is removed at a lower pressure than the atmospheric pressure.

FIG. 7A is a schematic diagram illustrating the inside of conductive ink at the atmospheric pressure. FIG. 7B is a schematic diagram illustrating the inside of conductive ink in the same conditions as in FIG. 7A except a pressure which is lower than the atmospheric pressure.

A conductive ink 770 includes micro-pores 773 when being manufactured while conductive particles 771 are dispersed in an organic material 772. Further, when the conductive ink 770 is jetted onto the substrate 110, the pores 773 may be included in the jetted conductive ink 770. The pores 773 form gaps between the conductive particles 771 and thus suppress conglomeration of the conductive particles 771. Thus, when the organic material 772 is removed from the conductive ink 770, it is necessary to remove the pores 773.

Depending on a difference between the pressures in FIG. 7A and FIG. 7B, a volume of the pores 773 in FIG. 7B becomes greater than a volume of the pore 773 in FIG. 7A. The inventors of the present disclosure induced the pores 773 in the conductive ink 770 to be increased in volume and the increased pores 773 to be exposed through a surface of the conductive ink 770 by setting an environment of a high-degree vacuum, a pressure of which is lower than the atmospheric pressure, as illustrated in FIG. 7B. Since the high-degree vacuum drying process was performed as such, as many micro-pores 773 as possible were removed from the conductive ink 770.

As can be seen from comparison between FIG. 7A and FIG. 7B, the inventors of the present disclosure reduced gaps between the conductive particles 771 in the conductive ink 770 by increasing a volume of the pores 773 so as to induce rapid conglomeration of the conductive particles 771. Further, the inventors of the present disclosure induced rapid conglomeration of the conductive particles 771 by inducing the conductive particles 771 to be moved toward the substrate 110 and settled in a state where the conductive particles 771 were dispersed in the organic material 772.

As such, the inventors of the present disclosure performed the high-degree vacuum drying process to the conductive ink 770 and induced the conductive particles 771 to be more rapidly, densely conglomerated. As a result, the inventors of the present disclosure manufactured the conductive path 120 where moving traces of the conductive particles 771 are substantially not seen.

In other words, as illustrated in FIG. 6, a size of the pull-back region remaining after the conductive path 120 is formed was minimized to be substantially close to 0. That is, the conductive path 120 was formed to have substantially the same shape as that of an initial design. Thus, a space between a border 621 to which the conductive ink is jetted and the conductive path 120 was substantially not recognized by the naked eye or through a microscope. That is, the conductive path 120 was formed to have substantially the same shape as that of an initial design, so that a pull-back region 660 was practically invisible to the naked eye. Herein, the pull-back region 660 illustrated in FIG. 6 is to describe that the pull-back region 660 is substantially not present or the pull-back region 660 is present but its size is too small to be recognized. That is, although illustrated in FIG. 6, the pull-back region 660 may not be present at all. In other words, the conductive path 120 according to an exemplary embodiment of the present disclosure may not include the pull-back region 660 since the conductive path 120 is overlapped with the border 621 to which the conductive ink is jetted.

Further, the conductive path 120 was manufactured to have a flatter surface than the conventional conductive path to which the high-degree vacuum drying process is not performed. Furthermore, the conductive path 120 was manufactured to include a smaller volume of micro-pores than the conventional conductive path to which the high-degree vacuum drying process is not performed.

As compared with the conventional conductive path, the conductive path 120 according to an exemplary embodiment of the present disclosure has a remarkably small size of a nearby pull-back region and a higher uniformity in shape of the conductive path. More specifically, a volume of pores per unit volume in the conductive path 120 to which the high-degree vacuum drying process is performed according to an exemplary embodiment of the present disclosure is smaller than a volume of pores per unit volume in a conventional conductive path manufactured under the same conditions as the conductive path 120 according to an exemplary embodiment of the present disclosure except that the drying process is performed at the atmospheric pressure. Further, a surface of the conductive path 120 to which the high-degree vacuum drying process is performed according to an exemplary embodiment of the present disclosure is flatter than a surface of the conventional conductive path manufactured under the same conditions as the conductive path 120 according to an exemplary embodiment of the present disclosure except that the drying process is performed at the atmospheric pressure. Furthermore, a density of the conductive path 120 to which the high-degree vacuum drying process is performed according to an exemplary embodiment of the present disclosure is higher than a density of the conductive path manufactured under the same conditions as the conductive path 120 according to an exemplary embodiment of the present disclosure except that the drying process is performed at the atmospheric pressure. Therefore, a sheet resistance value of the conductive path 120 to which the high-degree vacuum drying process is performed according to an exemplary embodiment of the present disclosure and which has a higher uniformity in shape and a higher density than those of the conventional conductive path is lower than a sheet resistance value of the conventional conductive path manufactured under the same conditions as the conductive path 120 according to an exemplary embodiment of the present disclosure except that the drying process is performed at the atmospheric pressure.

Accordingly, the conductive path 120 according to an exemplary embodiment of the present disclosure can more readily transport an electrical signal than the conventional conductive path to which the drying process is performed at the atmospheric pressure.

Meanwhile, while the conductive path 120 is manufactured by a method of evaporating or vaporizing the organic solvent from the conductive ink, an ink-peeling region may be formed on the conductive path 120. Hereinafter, the ink-peeling region will be described with reference to FIG. 9.

Figures 9A, 9B, 9C:
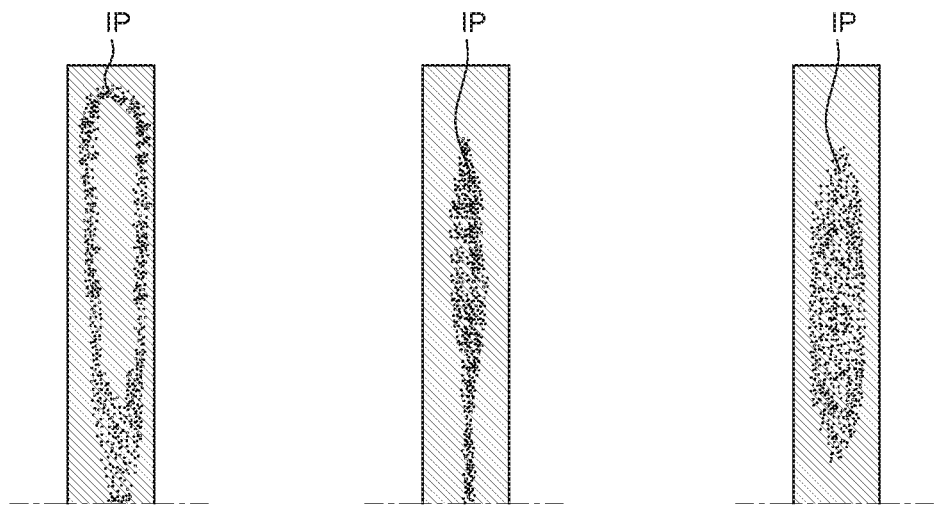
FIG. 9A through FIG. 9C are plan views enlarging a portion corresponding to an extension portion of a conventional conductive path.

FIG. 9A through FIG. 9C are plan views enlarging a portion corresponding to an extension portion of a conventional conductive path.

FIG. 9A through FIG. 9C illustrate ink-peeling at specific spots (for example, thick portions of a conductive path) when the conductive path is formed of jetted conductive ink through a curing or sintering process. The jetted conductive ink has flowability and thus tends to reconfigure a shape so as to have a minimum surface tension. When the conductive ink reconfigures a shape, a certain spot in the conductive ink has a greater volume of the conductive ink than the other spots. That is, a certain spot in the conductive ink has a greater thickness than the other spots. If a curing or sintering process is performed to the conductive ink with a difference in volume or thickness between spots, ink-peeling occurs at a spot having a greater volume or thickness of the conductive ink than the other spots. FIG. 9A through FIG. 9C illustrate ink-peeling IP as assemblies of dots. The ink-peeling IP means a shape similar to dust flake formed in a puddle when the puddle dries up after rain. In the conductive path, the amount of an organic solvent remaining in the ink-peeling region IP is greater than the amount of an organic solvent remaining in a region other than the ink-peeling region IP. As a difference in volume or thickness of the conductive ink between spots increases, a possibility of occurrence of ink-peeling IP increases. Herein, a spot where the ink-peeling IP occurs has a greater volume or thickness of the conductive ink than the other spots.

If there is a great difference in volume of the conductive ink between spots, the organic solvent is erupted by vaporization during a curing or sintering process and the conductive path bursts at an eruption spot. Around the spot where the conductive path bursts, an ink-peeling region is present. If a burst of the conductive path occurs regionally, the conductive path is not electrically disconnected. However, during a cleaning process with distilled water after the curing or sintering process, the burst of the conductive path may serve as a crack through which the distilled water permeate. The distilled water permeating through the burst of the conductive path leaks under the ink-peeling IP which is lifted in part. Thus, the conductive path is lifted.

Particularly, if a connector portion is disposed at an end of a protective layer, an occurrence of the ink-peeling IP around the connector portion causes a loss of an extension portion. Even if the burst of the conductive path does not coexist with the ink-peeling IP around the connector portion, the distilled water leaks into a crack at an end of the protective layer lifted by the ink-peeling IP during the cleaning process. Thus, the conductive path is lifted. As a result, if the jetted conductive ink generally does not have a balance, a part of the conductive path may be lost during a process. As such, similar to the pull-back region 560, the ink-peeling region IP also reflects non-uniformity in shape or performance of the conductive path.

As a result, similar to the pull-back region 560, from a shape or a size of the ink-peeling region IP, a shape and performance of the conductive path can be indirectly determined. More specifically, it can be determined that as a size of the ink-peeling region IP increases, uniformity in shape of the conductive path decreases. Further, it can be determined that as a size of the ink-peeling region IP increases, performance of the conductive path decreases.

A design of a conductive path is relevant to a design of jetted conductive ink. The inventors of the present disclosure paid attention to a tendency of the conductive ink when the conductive ink reconfigures a shape depending on a surface tension. Further, the inventors of the present disclosure studies a design of jetted conductive ink and conducted an experiment several times. The conductive path 120 according to an exemplary embodiment of the present disclosure will be described with reference to FIG. 10 through FIG. 13.

FIG. 10 through FIG. 13 are enlarged plan views of an area Z of FIG. 8 where the extension portion 130 of the conductive path 120 of FIG. 8 is disposed.

FIG. 10A through FIG. 10D illustrate designs of conductive ink jetted corresponding to the extension portion 130 having a small-loop shape according to an exemplary embodiment of the present disclosure. In FIG. 10A through FIG. 10D, the conductive ink jetted corresponding to the extension portion 130 having a small-loop shape according to an exemplary embodiment of the present disclosure has a width of several hundred μm in the entire area. Thus, the extension portion 130 also has a width of several hundred μm in the entire area.

Figure 10A:
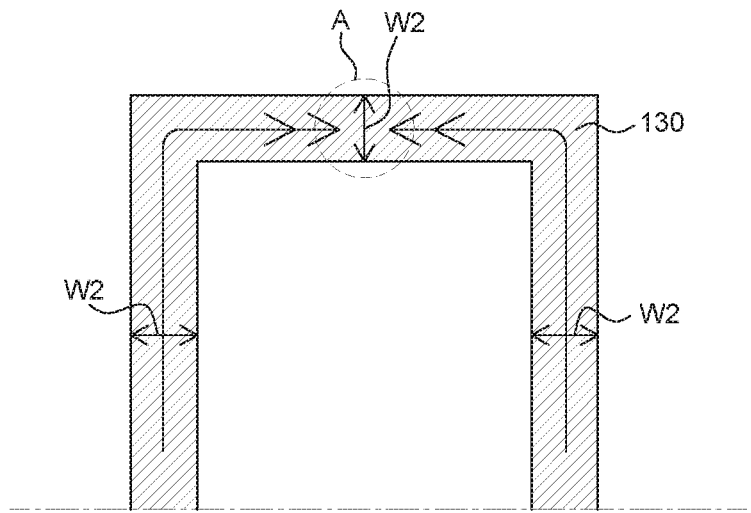
FIG. 10A through FIG. 10D are plan views illustrating designs of a conductive ink jetted to an extension portion 130 having a small-loop shape according to an exemplary embodiment of the present disclosure.

FIG. 10A illustrates conductive ink jetted corresponding to the extension portion 130 having one open-loop shape. In FIG. 10A, the conductive ink jetted corresponding to the extension portion 130 has the same width W2 in the entire area of the open loop. Since the extension portion 130 has a loop shape, there is formed a path through which the conductive ink flows from both sides of an end of the extension portion 130 to a center A of the end of the extension portion 130. That is, a shape of the conductive ink is reconfigured such that the conductive ink flows from the both sides of the end of the extension portion 130 to the center A of the end of the extension portion 130. Therefore, a curing or sintering process is performed to the center A of the end of the extension portion 130 with a greater volume or thickness than the other spots. Thus, the above-described ink-peeling IP is highly likely to occur.

Figure 10B:
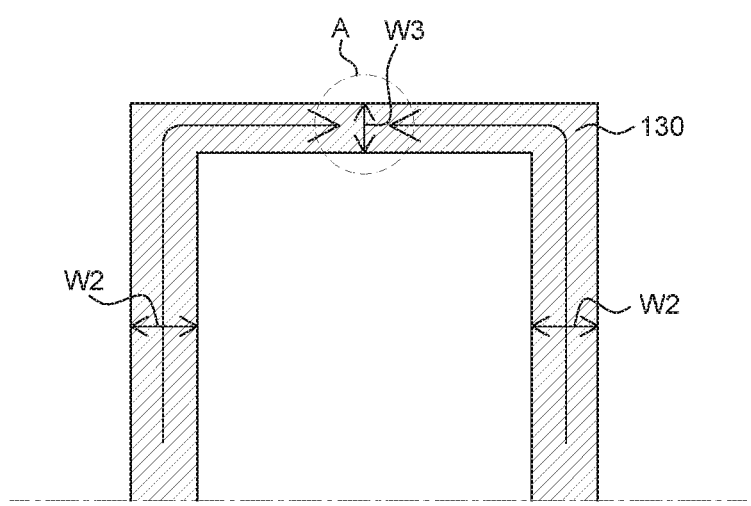

FIG. 10B illustrates conductive ink jetted corresponding to the extension portion 130 having one open-loop shape. In the conductive ink jetted corresponding to the extension portion 130 illustrated in FIG. 10B, an end of the extension portion 130 has a width W3 smaller than W2 and the other area has the width W2. That is, by comparison between the conductive ink jetted corresponding to the extension portion 130 illustrated in FIG. 10B and the conductive ink jetted corresponding to the extension portion 130 illustrated in FIG. 10A, there is a difference in width of the end of the extension portion 130. If the end of the extension portion 130 has a smaller width than the both sides of the end of the extension portion 130, the amount of the conductive ink flowing from the both sides of the end of the extension portion 130 to the center A of the end of the extension portion 130 decreases. This is because if the end of the extension portion 130 has a smaller width, a volume of the conductive ink which can be accommodated by the width decreases due to a surface tension, and, thus, the amount of the conductive ink concentrating on the end of the extension portion 130 decreases. As such, by designing the end of the extension portion 130 to have a smaller width than the other spots, the extension portion 130 has a balance of a volume or thickness of the conductive ink between the center A of the end of the extension portion 130 and the other spots. Since the extension portion 130 has a balance of a volume or thickness of the conductive ink between the center A of the end of the extension portion 130 and the other spots, a possibility of occurrence of the ink-peeling IP decreases after a curing or sintering process. Herein, when the conductive path is formed through the curing or sintering process, the end of the extension portion 130 is also maintained at a smaller width than the other spots of the extension portion 130.

Figure 10C:
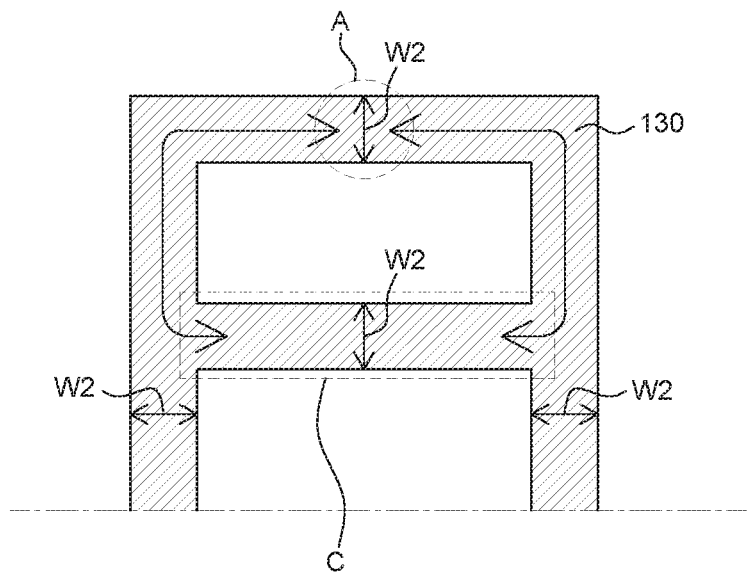

FIG. 10C illustrates conductive ink jetted corresponding to the extension portion 130 having one closed-loop shape. In FIG. 10C, the conductive ink jetted corresponding to the extension portion 130 has the same width W2 in the entire area of the extension portion 130. That is, by comparison between the conductive ink jetted corresponding to the extension portion 130 illustrated in FIG. 10C and the conductive ink jetted corresponding to the extension portion 130 illustrated in FIG. 10A, there is a difference in presence or absence of a closed-loop shape. That is, in the conductive ink jetted corresponding to the extension portion 130 illustrated in FIG. 10C, an end of the extension portion 130 and both sides of the end of the extension portion 130 form a closed-loop shape. In other words, a bridge C connecting the both side of the end of the extension portion 130 is disposed across from the end of the extension portion 130, and they form the closed-loop shape. Since the conductive ink jetted corresponding to the extension portion 130 illustrated in FIG. 10C has the closed-loop shape adjacent to the end of the extension portion 130, the amount of the conductive ink flowing from the both sides of the end of the extension portion 130 to the center A of the end of the extension portion 130 decreases. This is because (1) a path (hereinafter, referred to as "first path") through which the conductive ink flows from the both sides of the end of the extension portion 130 to the center A of the end of the extension portion 130 and (2) a path (hereinafter, referred to as "second path") through which the conductive ink flows from the both sides of the end of the extension portion 130 to the bridge C are added due to the closed-loop shape. In other words, a shape of the conductive ink is reconfigured such that the conductive ink flows not only to the center A of the end of the extension portion 130 but also to the bridge C connecting the both sides of the end of the extension portion 130.

The closed-loop shape is formed by the bridge C, and, thus, a path through which the conductive ink flows is divided or added. Therefore, the conductive ink flows through the first path and the second path. Thus, the amount of the conductive ink flowing into the first path decreases as compared with the case where the bridge C is not present. Accordingly, the extension portion 130 has a balance of a volume or thickness of the conductive ink between the center A of the end of the extension portion 130 and the other spots. Since the extension portion 130 has a balance of a volume or thickness of the conductive ink between the center A of the end of the extension portion 130 and the other spots, a possibility of occurrence of the ink-peeling IP decreases after a curing or sintering process. Herein, when the conductive path is formed through the curing or sintering process, the extension portion 130 is also maintained in the closed-loop shape.

Figure 10D:
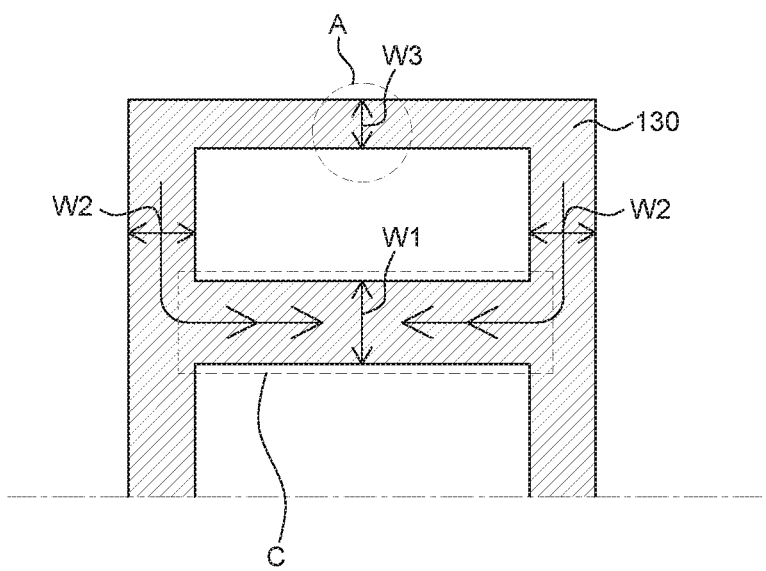

FIG. 10D illustrates conductive ink jetted corresponding to the extension portion 130 having one closed-loop shape. In the conductive ink jetted corresponding to the extension portion 130 illustrated in FIG. 10D, a bridge C connecting both sides of an end of the extension portion 130 has a width W1 greater than W2 and the both sides of end of the extension portion 130 have the width W2. Further, the end of the extension portion 130 has the width W2 or the width W3 smaller than W2. That is, by comparison between the conductive ink jetted corresponding to the extension portion 130 illustrated in FIG. 10D and the conductive ink jetted corresponding to the extension portion 130 illustrated in FIG. 10C, there is a difference in whether or not the end of the extension portion 130 and the bridge C are different from each other in width. If the end of the extension portion 130 has a smaller width than the bridge C disposed across therefrom, the amount of the conductive ink flowing from the both sides of the end of the extension portion 130 to the center A of the end of the extension portion 130 decreases. This is because if the end of the extension portion 130 has a smaller width, a volume of the conductive ink which can be accommodated by the width decreases due to a surface tension, and, thus, the amount of the conductive ink concentrating on the end of the extension portion 130 decreases.

Therefore, by designing the end of the extension portion 130 to have a smaller width than the bridge C, the amount of the conductive ink flowing through the first path is decreased. Thus, a possibility of occurrence of the ink-peeling IP at the end of the extension portion 130 can be minimized. Further, the extension portion 130 has a balance of a volume or thickness of the conductive ink between the center A of the end of the extension portion 130 and the other spots. Since the extension portion 130 has a balance of a volume or thickness of the conductive ink between the center A of the end of the extension portion 130 and the other spots, a possibility of occurrence of the ink-peeling IP decreases after a curing or sintering process. Herein, when the conductive path is formed through the curing or sintering process, the extension portion 130 is also maintained in the closed-loop shape.

There has been described the tendency to reconfigure a shape of the conductive ink in order for a surface tension of the conductive ink jetted corresponding to the extension portion 130 having a small size-loop shape to be optimized. Considering this tendency, the inventors of the present disclosure suggest a design of a conductive path which does not cause an occurrence of the ink-peeling IP at the end of the extension portion 130 where the connector portion 150 is disposed. Details thereof will be described below with reference to FIG. 11 through FIG. 13 enlarging the area Z of FIG. 8.

Figure 11A:
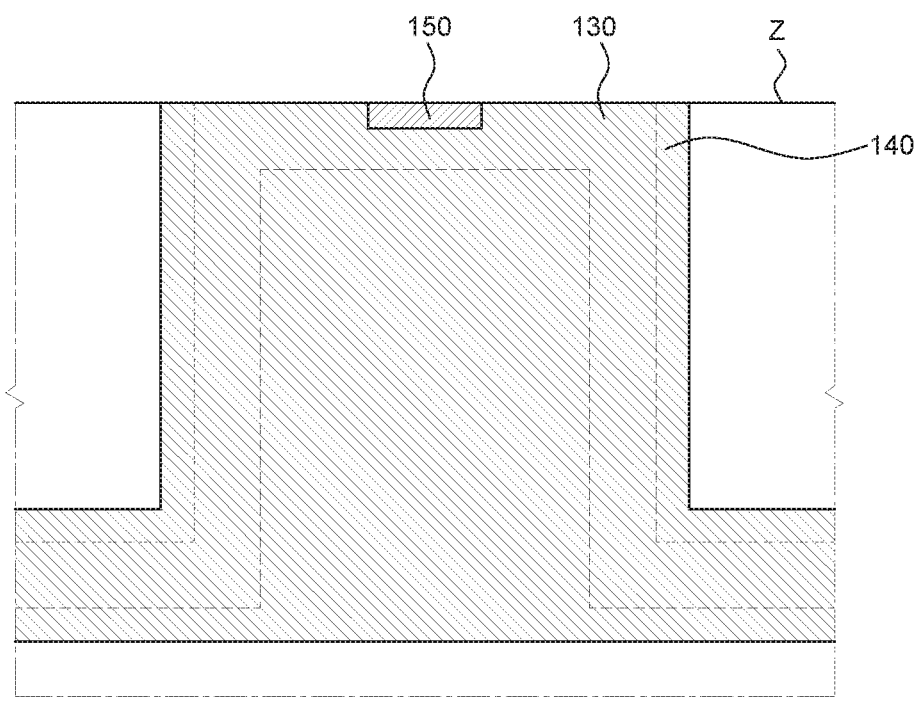
FIG. 11A through FIG. 11C are plan views of an area Z of FIG. 8 which enlarge an extension portion a conductive path including one small open-loop shape according to an exemplary embodiment of the present disclosure.
Figure 11B:
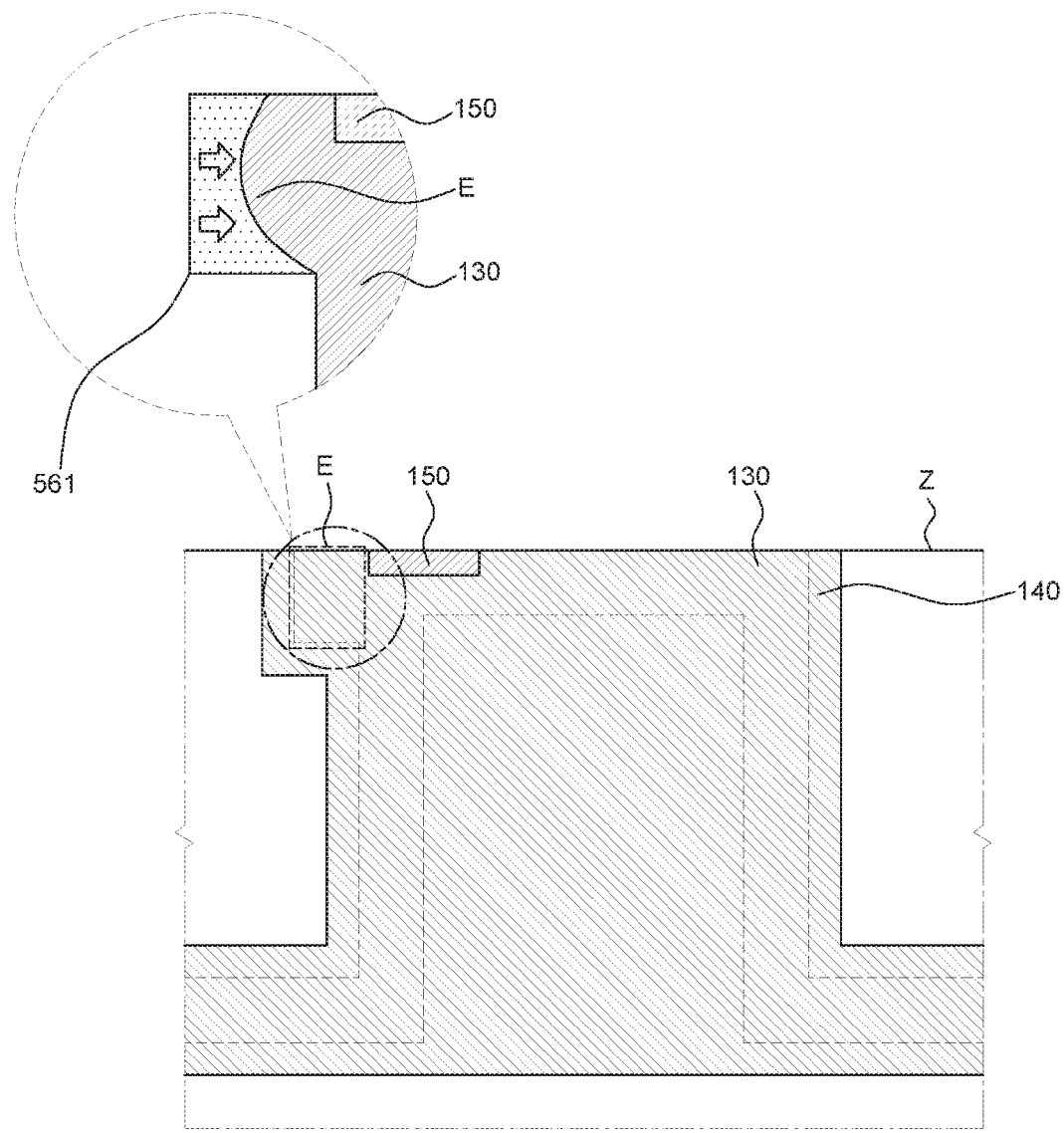
Figure 11C:
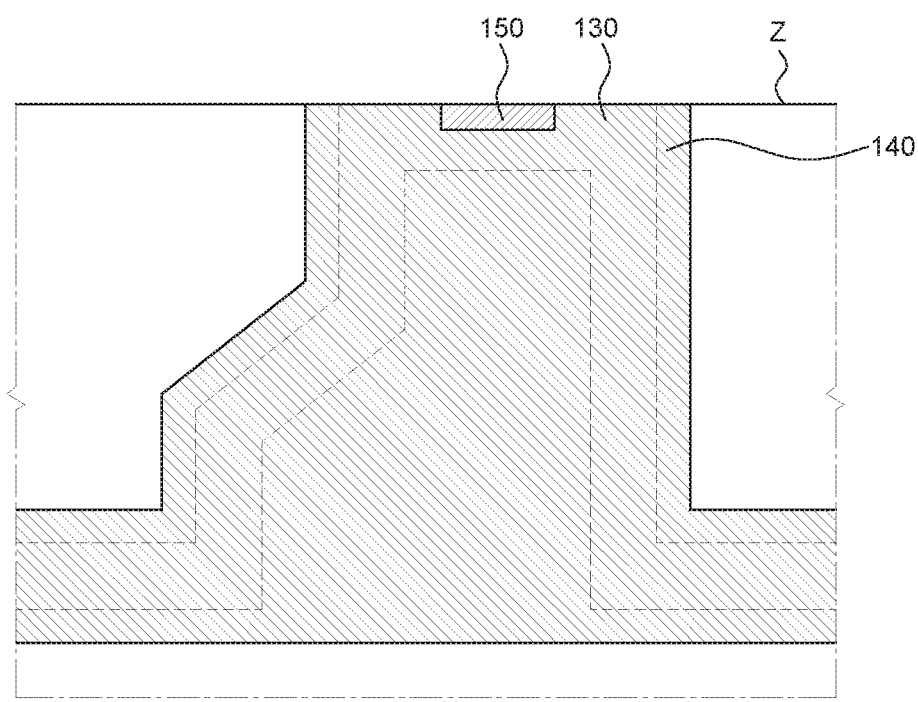

In FIG. 11A through FIG. 11C, each of at least one extension portion 130 included in the conductive path 120 according to an exemplary embodiment of the present disclosure has a small open-loop shape in order to minimize an occurrence of the ink-peeling IP. The conductive path 120 according to an exemplary embodiment of the present disclosure may have an integrated closed-loop shape. In this case, a size of a space by the loop shape of the conductive path 120 is greater than a size of a space by the small-loop shape of the extension portion 130.

Referring to FIG. 11A, each extension portion 130 has a small open-loop shape in order to minimize an occurrence of the ink-peeling IP. The small-loop shape may be a square ring shape. As for the extension portion 130 having the small-loop shape, the pull-back region 560 may occur on both corners of the end of the extension portion 130. Therefore, it may be preferable when the connector portion 150 is disposed at the center A of the end of the extension portion 130. In other words, since the pull-back region 560 may occur around the both corners of the extension portion 130 having the small-loop shape, the pull-back region 560 is not a big problem when the connector portion 150 is disposed at the center A of the end of the extension portion 130.

Referring to FIG. 11B, each extension portion 130 has a small open-loop shape and further includes an ear E protruded from one side of an end of the extension portion 130 in order to minimize an occurrence of the ink-peeling IP. If the connector portion 150 is disposed on one side of the end of the extension portion 130 rather than at the center A of the end of the extension portion 130, a conductive path is designed such that the ear E is protruded from the one side of the end of the extension portion 130. Therefore, even if the pull-back region 560 occurs around both corners of the extension portion 130, the pull-back region 560 occurs only in the protruded ear E but does not encroach on the end of the extension portion 130. Thus, the connector portion 150 can be disposed on one side of the end of the extension portion 130. The pull-back region 560 occurring adjacent to the ear E protruded from the extension portion 130 has the border 561 of the stain. A size of the pull-back region 560 may be the same as a size between the border 561 of the stain and the extension portion 130 as can be recognized with the naked eye or through a microscope. The ear E protruded from the extension portion 130 and present when the conductive ink is jetted may disappear since the pull-back region 560 is formed widely through a curing or sintering process to the jetted conductive ink. However, the border 561 of the stain from which a trace of the jetted conductive ink can be recognized still remains adjacent to the extension portion 130. Referring to a shape of the border 561 of the stain, it can be assumed that the ear E protruded from the extension portion 130 disappears when the pull-back region 560 is formed. Such an assumption is reasonable. In other words, even if the conductive path 120 does not include the ear E on one side of the end of the extension portion 130, it can be assumed whether or not the ear E is formed when the conductive ink is jetted referring to a shape of the pull-back region 560 adjacent to the end of the extension portion 130.

Herein, the extension portion 130 may be formed such that among both sides of the end of the extension portion 130, one side closer to the one side of the end of the extension portion 130 where the ear E is disposed has a smaller width than the other side farther from the one side of the end of the extension portion 130 where the ear E is disposed. Thus, the amount of the conductive ink is increased by adding the ear E. Due to the increased amount, it is possible to suppress ink-peeling IP, which may occur on one side, among both sides of the end of the extension portion 130, closer to the one side of the end of the extension portion 130 where the ear E is disposed, from extending to the end of the extension portion 130.

Referring to FIG. 11C, each extension portion 130 has a small open-loop shape in order to minimize an occurrence of the ink-peeling IP. The small-loop shape may be a polygonal ring shape. The small-loop shape of the extension portion 130 may be freely formed considering positions of the other components disposed around the extension portion 130.

Figure 12A:
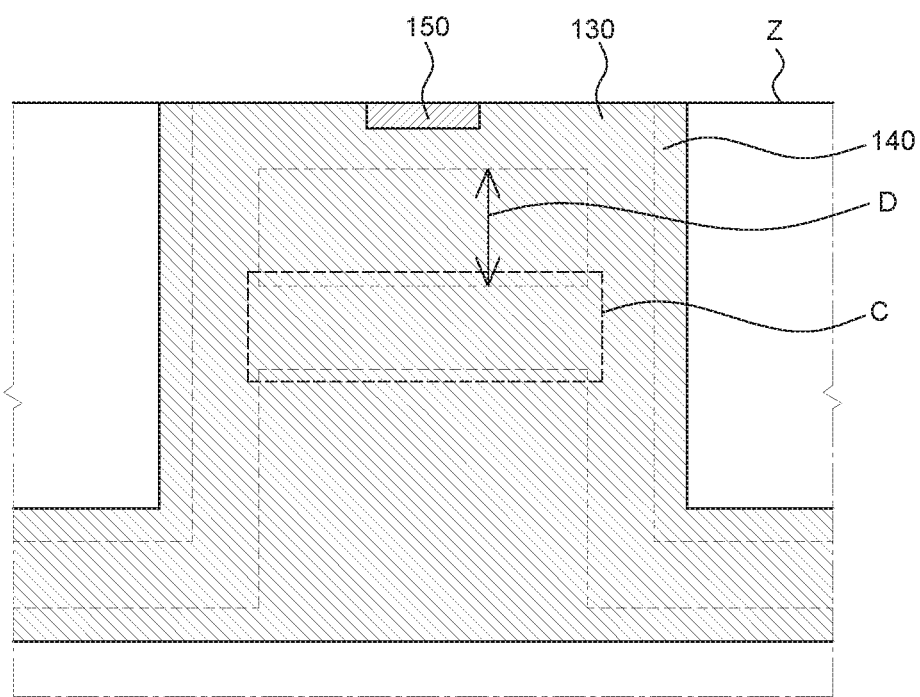
FIG. 12A and FIG. 12B are plan views of the area Z of FIG. 8 which enlarge an extension portion of a conductive path including one small closed-loop shape according to an exemplary embodiment of the present disclosure.
Figure 12B:
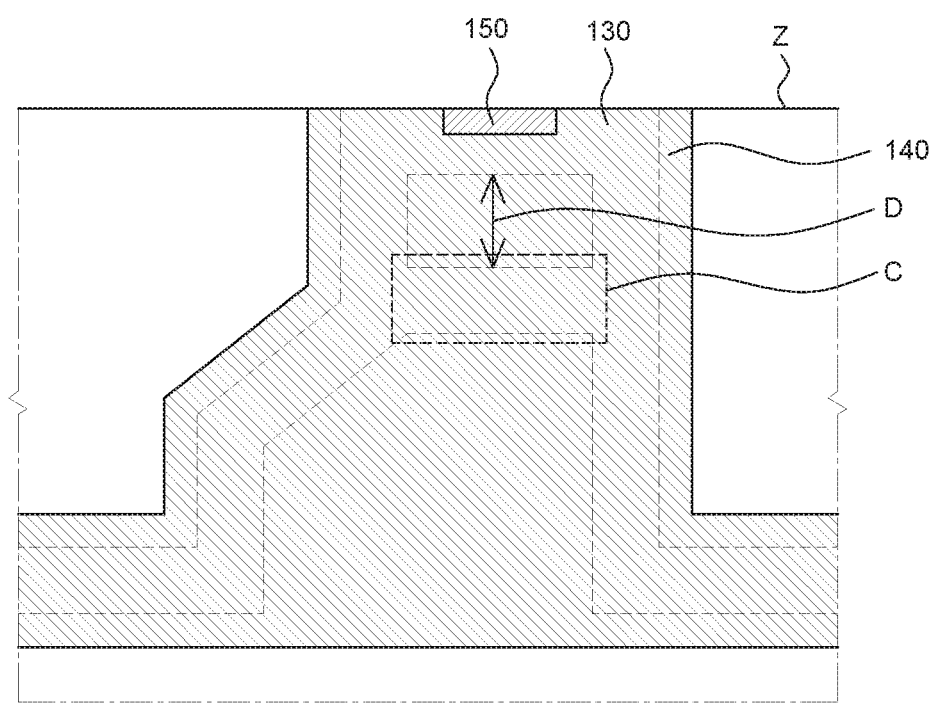

In FIG. 12A and FIG. 12B, each of at least one extension portion 130 included in the conductive path 120 according to an exemplary embodiment of the present disclosure has a small closed-loop shape in order to minimize an occurrence of the ink-peeling IP. The conductive path 120 according to an exemplary embodiment of the present disclosure may have an integrated closed-loop shape. In this case, a size of a space by the loop shape of the conductive path 120 is greater than a size of a space by the small-loop shape of the extension portion 130.

Referring to FIG. 12A, each extension portion 130 has a small closed-loop shape in order to minimize an occurrence of the ink-peeling IP. A bridge C connecting both sides of an end of the extension portion 130 has a greater width than the end of the extension portion 130. Therefore, as described above, the amount of the conductive ink flowing from the both sides of the end of the extension portion 130 to the center A of the end of the extension portion 130 decreases. As described with reference to FIG. 10D, by designing the end of the extension portion 130 to have a smaller width than the bridge C, the amount of the conductive ink flowing through the first path is decreased. Thus, a possibility of occurrence of the ink-peeling IP at the end of the extension portion 130 can be minimized. Further, the extension portion 130 has a balance of a volume or thickness of the conductive ink between the center A of the end of the extension portion 130 and the other spots. Therefore, the connector portion 150 may be disposed at the end of the extension portion 130 where the ink-peeling IP does not occur. Otherwise, the connector portion 150 may be disposed at a portion having a smallest width in the small-loop shape of the extension portion 130. Thus, it is possible to suppress the connector portion 150 from being disposed in an area where the ink-peeling IP occurs.

Referring to FIG. 12B, each extension portion 130 has a small closed-loop shape in order to minimize an occurrence of the ink-peeling IP. A width D of a space by the small-loop shape may be 1 time or more to 1.5 times or less the greatest width in the small-loop shape. The width D of the space by the small-loop shape is the same as a distance between an end of the extension portion 130 and a bridge C connecting both sides of the end of the extension portion 130. If the width D of the space by the small-loop shape is less than 1 time the greatest width in the small-loop shape, the end of the extension portion 130 and the bridge C may be connected to each other due to flowability of the conductive ink. Therefore, preferably, the width of the space by the small-loop shape may be 1 time or more the greatest width in the small-loop shape. If the width D of the space by the small-loop shape is more than 1.5 times the greatest width in the small-loop shape, an effect of decreasing the amount of the conductive ink flowing into the first path caused by division of the path into the first path and the second path is reduced. Therefore, preferably, the width D of the space by the small-loop shape may be 1.5 times or less the greatest width in the small-loop shape. Therefore, the width D of the space by the small-loop shape may be 1 time or more to 1.5 times or less the greatest width in the small-loop shape.

Further, referring to FIG. 12B, each extension portion 130 may also be regarded as having a small closed-loop shape and a small open-loop shape in order to minimize an occurrence of the ink-peeling IP. The closed-loop shape and the open-loop shape may be polygonal ring shapes. For example, a portion having the closed-loop shape of the extension portion 130 may have a square ring shape and an adjacent portion having the open-loop shape may have a pentagonal ring shape as illustrated in FIG. 12B.

Figure 13:
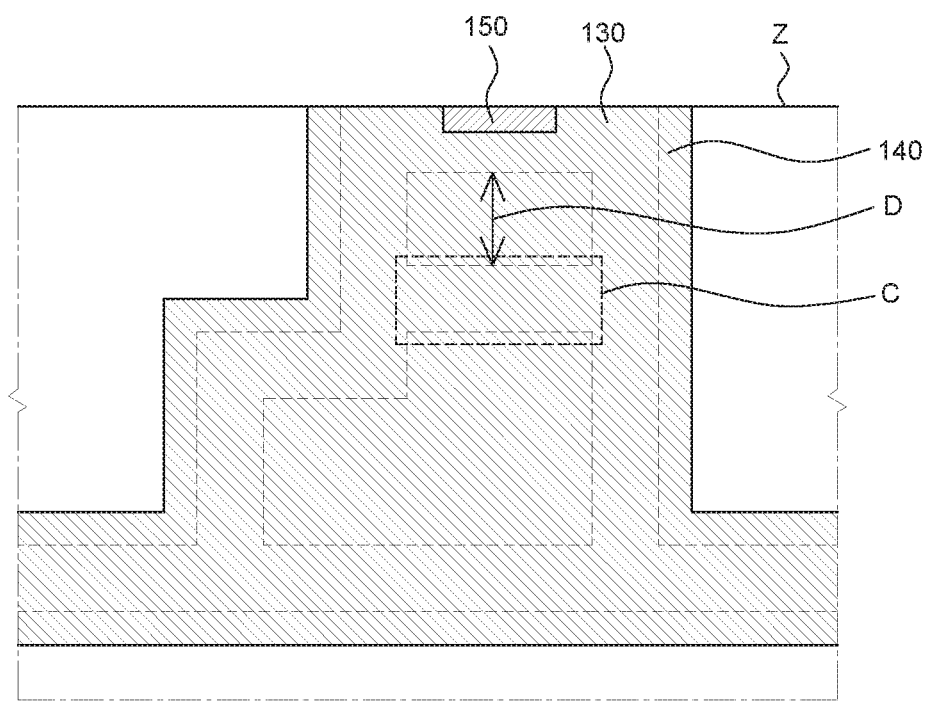
FIG. 13 is a plan view of the area Z of FIG. 8 which enlarges an extension portion of a conductive path including two small closed-loop shapes according to an exemplary embodiment of the present disclosure.

In FIG. 13, each of at least one extension portion 130 included in the conductive path 120 according to an exemplary embodiment of the present disclosure has two small closed-loop shapes in order to minimize an occurrence of the ink-peeling IP. The conductive path 120 according to an exemplary embodiment of the present disclosure may have an integrated closed-loop shape. In this case, a size of a space by the loop shape of the conductive path 120 is greater than a size of a space by the small-loop shape of the extension portion 130.

Referring to FIG. 13, each extension portion 130 has two small closed-loop shapes in order to minimize an occurrence of the ink-peeling IP. By dividing the path through which the conductive ink flows into several paths, it is possible to suppress concentration of the conductive ink on a specific spot of the extension portion 130. Thus, the extension portion 130 has a balance of a volume or thickness of the conductive ink at all spots.

Figure 4:
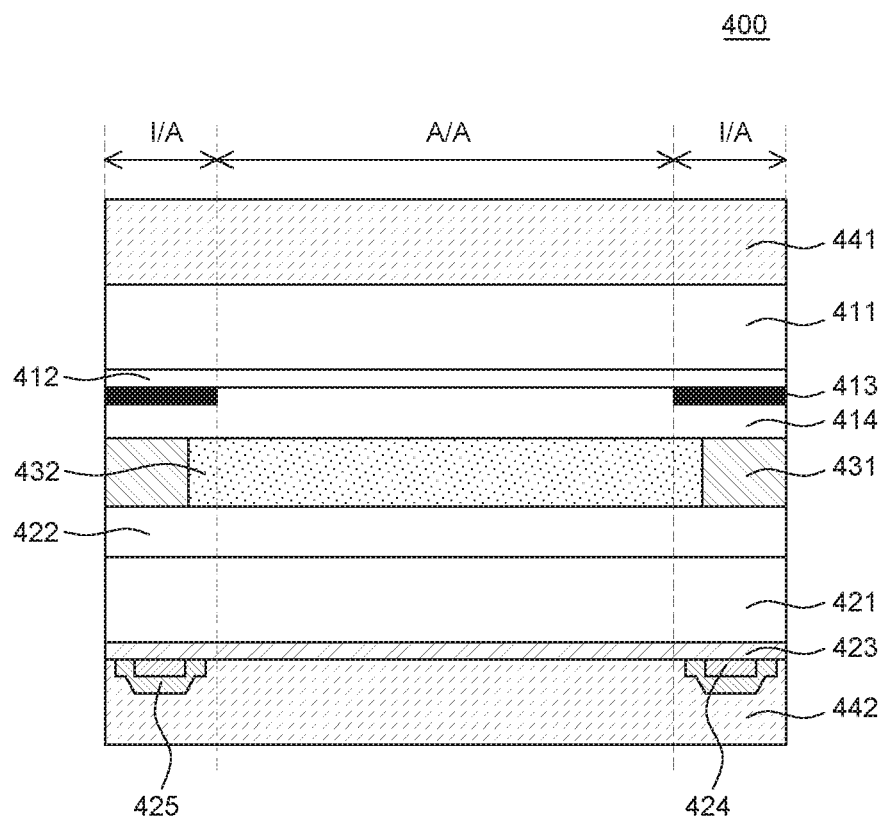
FIG. 4 is a cross-sectional view taken by cutting a cross section of a display panel according to an exemplary embodiment of the present disclosure.

Hereinafter, the display panel including a conductive path illustrated in FIG. 1 according to an exemplary embodiment of the present disclosure will be described. FIG. 4 is a cross-sectional view taken by cutting a cross section of a display panel according to an exemplary embodiment of the present disclosure.

A display panel 400 illustrated in FIG. 4 according to an exemplary embodiment of the present disclosure is illustrated as, for example, a liquid crystal display (LCD). Such an example is provided only for illustration of the concept of the present disclosure, but the present disclosure is not limited thereto. More specifically, the display panel according to an exemplary embodiment of the present disclosure may be an organic light emitting display (OLED).

The display panel 400 illustrated in FIG. 4 according to an exemplary embodiment of the present disclosure is illustrated as a display panel including a conductive path 424 having an integrated loop shape. However, such an example is provided only for illustration of the concept of the present disclosure, but the present disclosure is not limited thereto. More specifically, the display panel 400 according to an exemplary embodiment of the present disclosure may include the conductive path 424 manufactured by jetting a conductive ink and having a non-integrated loop shape. Otherwise, the display panel 400 according to an exemplary embodiment of the present disclosure may include the conductive path 424 manufactured by jetting the conductive ink and having a non-loop shape.

Referring to FIG. 4, the display panel 400 according to an exemplary embodiment of the present disclosure will be described.

The conductive path 424 may be disposed in the display panel 400 configured to display an image to be recognized by a user as information by emitting a light. The conductive path 424 may have an integrated loop shape. All of the descriptions of the conductive path 120 illustrated in FIG. 1 and FIG. 8 according to an exemplary embodiment of the present disclosure are applied to the conductive path 424. Therefore, the redundant description thereof will be omitted, and only a component which has not been described above will be further described.

In the display panel 400 according to an exemplary embodiment of the present disclosure, the conductive path 424 having an integrated loop shape is disposed in an inactive area I/A rather than an active area A/A where an image is displayed. The inactive area I/A is disposed around the active area A/A. For example, the inactive area I/A may be configured to surround the active area A/A. Herein, the conductive path 424 having an integrated loop shape may be configured to surround the active area A/A as being disposed in the inactive area I/A. The disposition of the conductive path 424 in the display panel 400 will be described in detail with reference to FIG. 4.

The display panel 400 according to an exemplary embodiment of the present disclosure is divided into the active area A/A and the inactive area I/A disposed around the active area A/A. The inactive area I/A is configured to surround the active area A/A. Therefore, the inactive area I/A is disposed adjacent to both edges of the display panel 400 in a cross-sectional view.

The display panel 400 according to an exemplary embodiment of the present disclosure includes a lower polarization layer 442 and a protective layer 425 disposed on the lower polarization layer 442 in the inactive area I/A. Further, the display panel 400 includes the conductive path 424 disposed on the protective layer 425 and the lower polarization layer 442 in the inactive area I/A and a conductive layer 423 disposed on the conductive path 424 and the lower polarization layer 442. Furthermore, the display panel 400 includes a lower substrate 421 disposed on the conductive layer 423, a TFT layer 422 disposed on the lower substrate 421, and a sealing portion 431 disposed on the TFT layer 422 in the inactive area I/A. Also, the display panel 400 includes a liquid crystal layer 432 filled in a gap disposed on the TFT layer 422, surrounded by the sealing portion 431, and spaced by a spacer, and a flattening layer 414 disposed on the sealing portion 431 and the liquid crystal layer 432. Moreover, the display panel 400 includes a black matrix 413 disposed on the flattening layer 414 and defining the inactive area I/A, a color filter layer 412 disposed on the black matrix 413 and the flattening layer 414, an upper substrate 411 disposed on the color filter layer 412, and an upper polarization layer 441 disposed on the upper substrate 411.

Herein, the conductive path 424 is the same component as the conductive path 120, the protective layer 425 is the same component as the protective layer 140, and the lower substrate 421 is the same component as the substrate 110. That is, all of the above descriptions of the conductive path 120 are applied to the conductive path 424, all of the above descriptions of the protective layer 140 are applied to the protective layer 425, and all of the above descriptions of the lower substrate 421 are applied to the substrate 110. Therefore, in the following, the redundant description thereof may be omitted, and a new description relating to FIG. 4 may be added.

The components included in the display panel 400 are disposed on the upper substrate 411, and the upper substrate 411 is configured to support a shape of the display panel 400. That is, the upper substrate 411 serves as a basic frame for the display panel 400. The upper substrate 411 may be fixed in a flat state or fixed in a bent or curved state, or may be provided with flexibility. Further, the upper substrate 411 may be formed of a glass or a plastic-based polymer material. The upper substrate 411 may be transparent or translucent.

The black matrix 413 is formed to shield an edge area where an image is not displayed on the upper substrate 411 of the display panel 400. Herein, an area where the black matrix 413 is formed may be the inactive area I/A. An area, i.e., the active area A/A where an image is displayed to a user is defined by the black matrix 431. The black matrix 431 is configured to shield various lines, signal lines, and tapes, and may include a black resin that absorbs light.

A touch sensor may be positioned inside or outside the display panel 400. The touch sensor may be formed as a touch screen panel including a separate substrate and combined with the display panel 400. Otherwise, the touch sensor may be formed into a film and combined with the display panel 400. Alternatively, the touch sensor may be formed into a touch electrode as a component of the display panel 400 and positioned on the upper substrate 411 and/or the lower substrate 421.

The TFT layer 422 may include a plurality of gate lines separated from each other in a predetermined gap and disposed in one direction, a plurality of data lines separated from each other in a predetermined gap and disposed in a direction perpendicular to the respective gate lines, a plurality of pixel electrodes formed into a matrix shape in respective pixel areas defined by the respective gate lines and the respective data lines intersecting with each other, and a plurality of thin film transistors (TFT) which are switched by signals from the gate lines and transfer signals from the data lines to the pixel electrodes, respectively. A liquid crystal in the liquid crystal layer 432 is driven by the TFT layer 422. A pixel area may be defined by at least one gate line and at least one data line, but is not necessarily limited thereto. For example, a pixel area and an adjacent pixel area may share a gate line, or a pixel area and an adjacent pixel area may share a data line.

The conductive layer 423 may be introduced to suppress errors of touch signals caused by driving signals applied to the TFT layer 422 for driving the liquid crystal. In this case, the conductive layer 423 serves as a signal interference shield layer. An electrical signal may be applied to a touch electrode of the touch sensor (not illustrated) to detect a touch position. At the same time, an electrical signal may be applied to a pixel electrode (not illustrated) and a common electrode (not illustrated) of the TFT layer 422 to drive the liquid crystal. In this case, the touch electrode of the touch sensor (not illustrated) and the pixel electrode (not illustrated) or common electrode (not illustrated) of the TFT layer 422 become a first electrode and a second electrode, respectively. Further, various structures as dielectric members are provided between the first and second electrodes, so that a parasitic capacitance is formed. In the parasitic capacitance, the electrical signal applied to the pixel electrode or common electrode of the TFT layer 422 causes interference in the electrical signal applied to the touch electrode of the touch sensor. That is, the electrical signal applied to the pixel electrode or common electrode of the TFT layer 422 acts as a noise on the electrical signal applied to the touch electrode of the touch sensor.

If the touch sensor is formed as an in-cell touch sensor disposed on the TFT layer 422, the conductive layer 423 may be formed on a back surface of the lower substrate 421 on which the TFT layer 422 is formed. That is, if a surface of the lower substrate 421 on which the TFT layer 422 is formed is referred to as one side surface, the conductive layer 423 is formed on the other side surface of the lower substrate 421. Herein, the conductive layer 423 needs to be transparent in order for a light emitted from a backlight unit (not illustrated), which will be combined with the display panel 400, to be incident into the display panel 400.

Meanwhile, if the touch sensor (not illustrated) is formed as an on-cell touch sensor disposed on the color filter layer 412, the conductive layer 423 is formed on a back surface of the upper substrate 411 on which the color filter layer 412 is formed. That is, if a surface of the upper substrate 411 on which the color filter layer 412 is formed is referred to as one side surface, the conductive layer 423 is formed on the other side surface of the upper substrate 411. Herein, the conductive layer 423 needs to be transparent since the conductive layer 423 is positioned in a direction of a light being polarized from the liquid crystal layer 432 and emitted from the display panel 400.

As a result, the conductive layer 423 may be formed of a transparent and conductive material. For example, the conductive layer 423 may be formed of any one selected from indium oxide, tin oxide, zinc oxide, indium-tin oxide, indium-zinc oxide, tin-antimony oxide, graphene, carbon nano tube, Ag nano particle, Ag nano wire, and a thin metal mesh. The conductive layer 423 may be formed to be thin enough to transmit light.

If the conductive layer 423 is included in the display panel 400 according to an exemplary embodiment of the present disclosure, the conductive path 424 may be positioned in direct contact with one side surface of the conductive layer 423. Further, a sheet resistance value of the conductive path 424 may be smaller than a sheet resistance value of the conductive layer 423. This is because the conductive path 424 needs to further improve a signal interference shield effect of the conductive layer 423. More specifically, in order to uniformly reduce a touch noise in the entire surface of the display panel 400 according to an exemplary embodiment of the present disclosure, the conductive path 424 having a smaller sheet resistance value than the conductive layer 423 is provided. Further, the conductive path 424 may be positioned so as to correspond to the inactive area I/A defined by the black matrix 413. Thus, the conductive path 424 may be positioned in the inactive areas I/A while being in direct contact with the one side surface of the conductive layer 423, and may be formed into a ring shape surrounding the active area A/A.

In order to remove static electricity induced on the back surface of the upper substrate 411 or the back surface of the lower substrate 421 by the parasitic capacitance causing a touch signal interference, the conductive layer 423 is formed so as to be in direct contact with the back surface of the upper substrate 411 or the back surface of the lower substrate 421 and the conductive layer 423 is grounded. In this case, both the conductive layer 423 and the conductive path 424 are grounded. Herein, the conductive layer 423 functions to shield the entire surface of the upper substrate 411 and the lower substrate 421. Thus, the conductive layer 423 is positioned in the active area A/A. As a result, the entire surface of the conductive layer 423 needs to be transparent. Further, a highly conductive material may be selected as a material constituting the conductive layer 423. Therefore, in order to more readily remove a noise from the entire surface of the conductive layer 423, the conductive path 424 having a smaller sheet resistance value than the conductive layer 423 is formed to be in direct contact with the one side surface of the conductive layer 423. Further, the conductive path 424 is grounded through at least one connector portion where the conductive path 424 is disposed. According to a mechanism in which static electricity induced on the back surface of the upper substrate 411 or the back surface of the lower substrate 421 is discharged through the conductive layer 423 and the conductive path 424, it is possible to reduce touch signal interference and thus possible to suppress errors of touch operations.

As such, if the conductive layer 423 is in contact with the conductive path 424 in the display panel 400 according to an exemplary embodiment of the present disclosure, the conductive layer 423 and the conductive path 424 are electrically connected to each other. Thus, they have substantially the same potential. Further, if the conductive layer 423 is in contact with the conductive path 424 in a state where the display panel 400 according to an exemplary embodiment of the present disclosure is on, the conductive layer 423 and the conductive path 424 have an unchanged and fixed potential.

The protective layer 425 is formed so as to be in contact with the conductive path 424. Since a width of the protective layer 425 is greater than a width of the conductive path 424, the protective layer 425 may cover the conductive path 424. However, in some cases, the conductive path 424 needs to be connected to other lines in order to be applied with a voltage or grounded. In order to do so, the protective layer 425 may expose a part of the conductive path 424. The protective layer 425 is formed of a material easily bonded to the conductive path 424 and the conductive layer 423. FIG. 4 illustrates that the protective layer 425 is patterned along a shape of the conductive path 424. However, if the protective layer 425 is transparent and has the same refractive index as the conductive layer 423, the protective layer 425 may be continuously positioned in the active area and the inactive area without being patterned. Due to the protective layer 425, a loss of the conductive path 424 can be minimized.

Hereinafter, a method for manufacturing a display panel will be described according to an exemplary embodiment of the present disclosure. If the components described above in explaining the display panel according to an exemplary embodiment of the present disclosure are the same as components to be described in explaining the method for manufacturing a display panel according to an exemplary embodiment of the present disclosure, the same explanation is applied. Thus, the redundant descriptions of the respective components will be omitted.

The method for manufacturing a display panel according to an exemplary embodiment of the present disclosure includes: providing an inactive area of a substrate with ink in which conductive particles are dispersed in a polar organic solvent so as to surround an active area; removing the polar organic solvent from the ink in a high-degree vacuum condition; forming a conductive path by curing the ink in a high temperature condition; providing an insulating material to cover a surface of the conductive path; and exposing a part of the surface of the conductive path. These processes may be carried out in sequence or some of the processes may be carried out simultaneously.

Herein, the providing of an insulating material may include providing an insulating organic material and forming a protective layer by curing the insulating organic material in a high temperature condition.

Herein, in order to remove the polar organic solvent, the polar organic solvent is removed by a phase transition from liquid to gas, i.e., vaporization. In other words, the removing of the polar organic solvent may include vaporizing the polar organic solvent. To do so, the removing of the polar organic solvent may include performing a high-degree vacuum drying process to the ink.

Herein, when performing a high-degree vacuum drying process, as a pressure for drying decreases, the boiling point of the solvent also decreases. Further, the ink is dried by vaporization of the polar organic solvent in the ink at a low temperature. By removing the polar organic solvent in the ink at a low temperature, it is possible to suppress a display panel vulnerable to a high temperature condition from being defective. The display panel vulnerable to a high temperature condition is known to become typically defective at a temperature of 130° C. or higher. Therefore, the high-degree vacuum drying process for reducing the boiling point of the polar organic solvent needs to be performed at a pressure at which the polar organic solvent can be vaporized at a temperature lower than 130° C. In other words, the high-degree vacuum condition refers to a condition set to a pressure at which the boiling point of the polar organic solvent is lower than 130° C. For example, the high-degree vacuum condition refers to a condition set to a predetermined pressure and a predetermined temperature. Herein, the predetermined pressure may be lower than the atmospheric pressure, and the predetermined temperature may be equal to or higher than the boiling point of the polar organic solvent at the predetermined pressure and may also be lower than 130° C. In addition, the high-degree vacuum condition refers to a condition in which a gas-state polar organic material vaporized from the polar organic solvent can be continuously discharged to the outside of the high-degree vacuum condition by suction.

Ink is a paste-state composition in which conductive particles are dissolved in a solvent and which has flow ability. As a result, in an ink manufacturing process for dispersing conductive particles, pores may be included in ink. Otherwise, in a process for providing ink to a substrate, pores may be included in the provided ink. These pores present in the ink need to be removed. Through the high-degree vacuum drying process, the pores can be removed from the ink. In other words, the removing of the polar organic solvent in a high-degree vacuum condition may be a process for removing the pores together with the polar organic solvent.

Further, the removing of the polar organic solvent and the forming of a conductive path may be carried out in sequence, or may be carried out simultaneously to further reduce a process time.

The method for manufacturing a display panel according to an exemplary embodiment of the present disclosure may further include forming a connector portion by exposing a part of the conductive path. Herein, the connector portion may be formed by removing a part of a protective layer disposed on an upper surface of the conductive path. Otherwise, the protective layer and the connector portion may be formed at the same time by disposing the protective layer on the upper surface of the conductive path except the connector portion. The connector portion may be formed into a shape in which the conductive path is protruded from the protective layer. Otherwise, the connector portion may be formed by forming a hole in the protective layer and exposing a part of the surface of the conductive path through the bottom of the hole. Herein, the forming of a connector portion by exposing a part of the upper surface of the conductive path by the protective layer may include forming a hole in the protective layer.

The method for manufacturing a display panel according to an exemplary embodiment of the present disclosure may further include cleaning the substrate and forming a polarization plate so as to be in contact with the protective layer after the exposing of a part of the conductive path.

The method for manufacturing a display panel according to an exemplary embodiment of the present disclosure may further include forming a conductive layer continuously disposed in the entire area of the active area and the inactive area before the providing of an inactive area of a substrate with ink in which conductive particles are dispersed in a polar organic solvent so as to surround an active area. Herein, the conductive layer may be a surface on which the ink is provided. That is, the conductive layer may be indirect contact with a lower surface of the conductive path.

Thus, in the display panel according to an exemplary embodiment of the present disclosure, the conductive path 120 or 424 having an integrated loop shape is formed in a continuous and seamless manner. Therefore, it is possible to provide the display panel including the conductive path 120 or 424 with a further minimized sheet resistance value or contact resistance value.

Further, in the display panel according to an exemplary embodiment of the present disclosure, the conductive path is covered by the protective layer. Therefore, it is possible to provide the display panel including the conductive path 120 or 424 with a minimized loss of an edge during the cleaning process.

Furthermore, according to the display panel according to an exemplary embodiment of the present disclosure, it is possible to provide the conductive path 120 or 424 and the display panel including the conductive path 120 or 424 which is more easily bonded to a surface on which the conductive path 120 or 424 is formed.

Also, in the display panel according to an exemplary embodiment of the present disclosure, the conductive path 120 or 424 having an integrated loop shape is formed so as to be in direct contact with the conductive layer (shielding layer) 423 for reducing a touch noise in the display panel. Therefore, it is possible to provide the display panel including the conductive path 120 or 424 which can more effectively discharge induced static electricity and improve a touch function.

Further, according to the display panel according to an exemplary embodiment of the present disclosure, it is possible to provide the display panel including the conductive path 120 or 424 in which a pull-back region remaining on or around the conductive path is substantially removed from an edge of the conductive path or a protruded region of the conductive path.

Furthermore, according to the display panel according to an exemplary embodiment of the present disclosure, it is possible to provide the display panel including the conductive path 120 or 424 having a generally uniform resistance value by substantially removing a pull-back region remaining on or around the conductive path.

Also, according to the display panel according to an exemplary embodiment of the present disclosure, it is possible to provide the display panel including the conductive path 120 or 424 which is formed in a reduced process time by substantially removing a pull-back region while removing the solvent from the conductive ink in a short time.

Further, according to the display panel according to an exemplary embodiment of the present disclosure, it is possible to provide the display panel including the conductive path 120 or 424 in which a pull-back region is substantially removed, and, thus, disconnection of the conductive path at any position is minimized.

Furthermore, according to the display panel according to an exemplary embodiment of the present disclosure, it is possible to provide the display panel including the conductive path 120 or 424 in which the conductive path is covered by the protective layer, so that a loss of an edge of the conductive path or a protruded region of the conductive path is minimized during the cleaning process.

Also, according to the display panel according to an exemplary embodiment of the present disclosure, it is possible to provide the display panel including the conductive path 120 or 424 in which a difference in thickness or volume between a spot of an extension portion of the conductive path with a greater thickness or volume of a conductive ink and the other spots of the extension portion is reduced, and, thus, it is possible to suppress ink-peeling at the spot with a greater thickness or volume of a conductive ink.

Further, according to the display panel according to an exemplary embodiment of the present disclosure, it is possible to provide the display panel including the conductive path 120 or 424 in which an extension portion of the conductive path has a small-loop shape or a bridge, and, thus, it is possible to minimize concentration of a conductive ink on an end of the extension portion where a connector portion is disposed.

Furthermore, according to the display panel according to an exemplary embodiment of the present disclosure, it is possible to provide the display panel including the conductive path 120 or 424 in which a conductive ink has a balance of a thickness or volume at all spots of an extension portion of the conductive path, and, thus, it is possible to suppress a burst of the conductive path during a curing or sintering process.

Also, according to the display panel according to an exemplary embodiment of the present disclosure, it is possible to provide the display panel including the conductive path 120 or 424 in which if a connector portion needs to be defined as being on one side of an extension portion of the conductive path, an ear is added to the one side of the extension portion, and, thus, a pull-back region can be spaced from the connector portion.

Further, according to the display panel according to an exemplary embodiment of the present disclosure, it is possible to provide the display panel including the conductive path in which the conductive path is formed of a conductive ink jetted and then cured or sintered, and, thus, it is possible to suppress a partial loss of the conductive path caused by permeation of distilled water through a crack during a cleaning process. The display panel according to an embodiment of the present disclosure includes a conductive path having a structure in which an organic material and conductive particles are conglomerated and to which a high-degree vacuum drying process is performed; and an insulating protective layer which covers the conductive path and includes a hole exposing a part of the conductive path. Herein, the conductive path is configured to be applied with an electrical signal through the hole. Further, a size of a pull-back region present around the conductive path may be smaller than a size of a pull-back region present around a conventional conductive path to which a drying process is performed at the atmospheric pressure.

Herein, the display panel may further include: an active area; and an inactive area positioned around the active area. The conducive path may be disposed in the inactive area and may have an integrated loop shape.

Herein, the high-degree vacuum drying process may be a process for a phase transition from liquid to gas, i.e., vaporization, of the polar organic material.

According to another aspect of the present disclosure, a volume of pores per unit volume in the conductive path may be smaller than a volume of pores per unit volume in the conventional conductive path to which the drying process is performed at the atmospheric pressure.

According to yet another aspect of the present disclosure, a surface of the conductive path may be flatter than a surface of the conventional conductive path to which the drying process is performed at the atmospheric pressure.

According to still another aspect of the present disclosure, a density of the conductive path may be higher than a density of the conventional conductive path to which the drying process is performed at the atmospheric pressure.

According to still another aspect of the present disclosure, a sheet resistance value of the conductive path may be lower than a sheet resistance value of the conventional conductive path to which the drying process is performed at the atmospheric pressure.

According to still another aspect of the present disclosure, the display panel further includes an active area; and an inactive area. Further, the conductive path to which the high-degree vacuum drying process is performed is disposed in the inactive area and may have an integrated loop shape.

According to still another aspect of the present disclosure, the display panel further includes a conductive layer disposed in the active area and the inactive area. Further, the conductive path may be in direct contact with a surface of the conductive layer.

According to still another aspect of the present disclosure, in the display panel, the hole is positioned on a surface of an extension portion of the conductive path, and the extension portion is extended toward the outside of the display panel.

According to still another aspect of the present disclosure, in the display panel, the conductive layer is transparent. Further, the conductive layer may be formed of any one selected from indium oxide, tin oxide, zinc oxide, indium-tin oxide, indium-zinc oxide, tin-antimony oxide, graphene, carbon nano tube, Ag nano particle, Ag nano wire, and a thin metal mesh.

According to still another aspect of the present disclosure, in the display panel, a sheet resistance value of the conductive path may be lower than a sheet resistance value of the conductive layer.

According to still another aspect of the present disclosure, in the display panel, the conductive particles may be metallic particles or metal alloy particles.

According to still another aspect of the present disclosure, in the display panel, the conductive particles may be formed of silver (Ag).

According to still another aspect of the present disclosure, in the display panel, the boiling point of the organic material may be 130° C. at a predetermined pressure between the atmospheric pressure and a pressure at the triple point.

The method for manufacturing a display panel according to an embodiment of the present disclosure includes: providing an inactive area of a substrate with ink in which conductive particles are dispersed in an organic solvent so as to surround an active area; removing the organic solvent from the ink in a high-degree vacuum condition; forming a conductive path by curing the ink in a high temperature condition; providing an insulating material to cover a surface of the conductive path; and exposing a part of the surface of the conductive path.

According to another aspect of the present disclosure, in the method for manufacturing a display panel, the removing of the organic solvent may include vaporizing the organic solvent.

According to yet another aspect of the present disclosure, in the method for manufacturing a display panel, the removing of the organic solvent may be a process for removing pores together with the organic solvent from the solvent.

According to still another aspect of the present disclosure, in the method for manufacturing a display panel, the high-degree vacuum condition refers to a condition set to a pressure at which the boiling point of the organic solvent is lower than 130° C.

According to still another aspect of the present disclosure, in the method for manufacturing a display panel, the high-degree vacuum condition refers to a condition set to a predetermined pressure and a predetermined temperature. Herein, the predetermined pressure may be lower than the atmospheric pressure, and the predetermined temperature may be equal to or higher than the boiling point of the organic solvent at the predetermined pressure and may be lower than 130° C.

According to still another aspect of the present disclosure, in the method for manufacturing a display panel, the exposing of a part of the surface of the conductive path is carried out by forming a hole in a protective layer and exposing a part of the surface of the conductive path.

According to still another aspect of the present disclosure, the method for manufacturing a display panel may further include forming a polarization plate so as to be in contact with the protective layer after cleaning the substrate.

According to still another aspect of the present disclosure, the method for manufacturing a display panel may further include forming a conductive layer to be in contact with a lower surface of the conductive path on the substrate.

According to still another aspect of the present disclosure, in the method for manufacturing a display panel, the removing of the organic solvent and the forming of a conductive path may be carried out at the same time.

According to an exemplary embodiment of the present disclosure, a display panel includes: a conductive path including at least one extension portion protruded and extended in a direction toward an end of a corner of the display panel and implemented with a conductive ink; a substrate on which the conductive path is disposed at an edge of one surface; a conductive layer between the substrate and the conductive path so as to be overlapped with the entire substrate; and a protective layer covering the conductive path along a shape of the conductive path and defining a connector portion by exposing a part of an end of the extension portion. Each of the extension portions has at least one small-loop shape to minimize an occurrence of ink-peeling.

According to another aspect of the present disclosure, in the display panel, the extension portion may be disposed such that the end of the extension portion and the end of the corner of the display panel share a cross section.

According to yet another aspect of the present disclosure, in the display panel, the protective layer may be disposed such that an end of the protective layer and the end of the extension portion share a cross section.

According to still another aspect of the present disclosure, in the display panel, the conductive path may have an integrated closed-loop shape, and a size of a space by the loop shape of the conductive path may be greater than a size of a space by the small-loop shape of the extension portion.

According to still another aspect of the present disclosure, in the display panel, the small-loop shape of the extension portion may be an open-loop shape.

According to still another aspect of the present disclosure, in the display panel, the small-loop shape of the extension portion may be a closed-loop shape.

According to still another aspect of the present disclosure, in the display panel, the extension portion may include two small closed-loop shapes, and the connector portion may be disposed on the small closed-loop shape closest to the end of the corner of the display panel.

According to still another aspect of the present disclosure, in the display panel, a width of a bridge connecting both sides of the end of the extension portion may be greater than a width of the end of the extension portion.

According to still another aspect of the present disclosure, in the display panel, the connector portion may be disposed on a portion having a smallest width in the small-loop shape.

According to still another aspect of the present disclosure, in the display panel, the connector portion may be defined by configuring the protective layer exposed up to the end of the extension portion.

According to still another aspect of the present disclosure, in the display panel, the small-loop shape may be a polygonal ring shape.

According to still another aspect of the present disclosure, in the display panel, a width of a space by the small-loop shape may be 1 time or more to 1.5 times or less the greatest width in the small-loop shape.

According to still another aspect of the present disclosure, the conductive path may include silver (Ag) and an organic material.

According to still another aspect of the present disclosure, in the display panel, an ear protruded from one side of the end of the extension portion may be further disposed.

According to still another aspect of the present disclosure, in the display panel, the connector portion may be disposed on one side of the end of the extension portion where the ear is provided.

According to still another aspect of the present disclosure, in the display panel, the extension portion may be disposed such that the end of the extension portion and the end of the corner of the display panel share a cross section.

According to an exemplary embodiment of the present disclosure, a conductive ink path on a peripheral portion of one surface of a substrate is provided. The conductive ink path comprises a body portion located along an edge of the peripheral portion of the substrate; and at least one extension portion protruded in a direction toward the edge of the substrate, wherein the extension portion includes at least one first segment extended in a first direction and at least two second segments neighboring on the first segment, the first segment includes a connector portion for transferring an electrical signal, and the first segment is located between the second segments and configured to disperse ink in the first segment to the second segments during a manufacturing process.

According to another aspect of the present disclosure, a minimum width of the second segment may be greater than a minimum width of the first segment such that an ink flow is controlled.

According to yet another aspect of the present disclosure, the body portion and the extension portion may be integrated.

According to still another aspect of the present disclosure, the first segment may be configured to be in contact with the edge of the substrate.

According to still another aspect of the present disclosure, the conductive ink path may further comprise a third segment protruded from one side of the first segment.

According to still another aspect of the present disclosure, the connector portion may be configured to be adjacent to the third segment.

According to still another aspect of the present disclosure, each of the first and second segments may have specific width and thickness in order to minimize ink-peeling.

According to still another aspect of the present disclosure, the width and thickness of each of the first and second segments may be determined based on at least one of density and viscosity, which affect flowability of the conductive ink.

According to an exemplary embodiment of the present disclosure, a display device comprises a substrate defined by an active area and an inactive area; a conductive layer on the substrate; a conductive ink path on the conductive layer; and a protective layer on the conductive ink path, wherein the conductive layer is in the active area and the inactive area, the conductive ink path is electrically connected to the conductive layer in the inactive area, the protective layer insulates the conductive ink path along a shape of the conductive ink path, wherein the conductive ink path includes a body portion surrounding the active area; and at least one extension portion protruded in a direction toward an edge of the substrate from the body portion, and wherein the body portion and the extension portion are connected to each other and configured into an integrated shape.

According to another aspect of the present disclosure, the extension portion may include a first segment parallel to the edge of the substrate; and two second segments neighboring on the first segment and connected to the first segment.

According to yet another aspect of the present disclosure, a minimum width of the first segment may be equal to or smaller than a minimum width of the second segment.

According to still another aspect of the present disclosure, the first segment may include a connector portion which is not overlapped with the protective layer.

According to still another aspect of the present disclosure, the extension portion may further include a third segment protruded from one end of the first segment.

According to still another aspect of the present disclosure, the connector portion may be configured to be adjacent to the third segment.

According to still another aspect of the present disclosure, each of the first and second segments may have specific width and thickness in order to minimize ink-peeling.

According to still another aspect of the present disclosure, the width and thickness of each of the first and second segments may be determined based on at least one of density and viscosity, which affect flowability of the conductive ink.

According to still another aspect of the present disclosure, the extension portion may further include a bridge portion between the second segments.

According to still another aspect of the present disclosure, a minimum width of the first segment may be equal to or smaller than a minimum width of the bridge portion.

According to still another aspect of the present disclosure, a minimum width of a space surrounded by the bridge portion, the first segment and the second segments may be equal to or 1.5 times or less a maximum value among maximum widths of the bridge portion, the first segment and the second segments, respectively.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A conductive ink path on a peripheral portion of one surface of a substrate, the conductive ink path comprising:
    a body portion located along an edge of the peripheral portion of the substrate; and
    at least one extension portion protruded in a direction toward the edge of the substrate,
    wherein the extension portion includes at least one first segment extended in a first direction and at least two second segments neighboring on the first segment,
    the first segment includes a connector portion for transferring receiving an electrical signal, and
    the first segment is located between the second segments and configured to disperse ink in the first segment to the second segments during a manufacturing process.

2. The conductive ink path according to claim 1, wherein a minimum width of the second segment is greater than a minimum width of the first segment such that an ink flow is controlled into the first segment.

3. The conductive ink path according to claim 1, wherein the body portion and the extension portion are integrated.

4. The conductive ink path according to claim 1, wherein the first segment is configured to be in contact with the edge of the substrate.

5. The conductive ink path according to claim 1, further comprising:
    a third segment protruded from one side of the first segment.

6. The conductive ink path according to claim 5, wherein the connector portion is configured to be adjacent to the third segment.

7. A display device comprising:
    a substrate defined by an active area and an inactive area;
    a conductive layer on the substrate;
    a conductive ink path on the conductive layer; and
    a protective layer on the conductive ink path,
    wherein the conductive layer is in the active area and the inactive area,
    the conductive ink path is electrically connected to the conductive layer in the inactive area,
    the protective layer insulates the conductive ink path along a shape of the conductive ink path,
    wherein the conductive ink path includes:
    a body portion surrounding the active area; and
    at least one extension portion protruded in a direction toward an edge of the substrate from the body portion, and
    wherein the body portion and the extension portion are connected to each other and configured into an integrated shape.

8. The display device according to claim 7, wherein the extension portion includes:
    a first segment parallel to the edge of the substrate; and
    two second segments neighboring on the first segment and connected to the first segment.

9. The display device according to claim 8, wherein a minimum width of the first segment is equal to or smaller than a minimum width of the second segment.

10. The display device according to claim 8, wherein the first segment includes a connector portion which is not overlapped with the protective layer.

11. The display device according to claim 10, wherein the extension portion further includes a third segment protruded from one end of the first segment.

12. The display device according to claim 11, wherein the connector portion is configured to be adjacent to the third segment.

13. The display device according to claim 8, wherein each of the first and second segments has specific width and thickness in order to minimize ink-peeling.

14. The display device according to claim 13, wherein the width and thickness of each of the first and second segments are determined based on at least one of density and viscosity, which affect flowability of the conductive ink.

15. The display device according to claim 8, wherein the extension portion further includes a bridge portion between the second segments.

16. The display device according to claim 15, wherein a minimum width of the first segment is equal to or smaller than a minimum width of the bridge portion.

17. The display device according to claim 15, wherein a minimum width of a space surrounded by the bridge portion, the first segment and the second segments is equal to or 1.5 times or less a maximum value among maximum widths of the bridge portion, the first segment and the second segments, respectively.

18. An apparatus, comprising:
    a substrate including an active area and an inactive area; and
    a ring-like structure surrounding the active area and made of conductive ink material, the ring-like structure including at least one loop section extending towards an edge of the substrate, the at least one loop section including a distal end at which a connection portion is located, the at least one loop section having a configuration that minimizes a pull-back region caused by contraction of the conductive ink material.

19. The apparatus of claim 18, wherein the configuration is achieved by having an ear-like protrusion near the connection portion.

20. The apparatus of claim 18, wherein the configuration is achieved by having a width of the distal end being less than a width of other portions of the loop section.

21. The apparatus of claim 18, wherein the ring-like structure is a single closed-loop shape.

* * * * *